US009853087B2

(12) United States Patent
Suh et al.

(10) Patent No.: US 9,853,087 B2
(45) Date of Patent: Dec. 26, 2017

(54) MAGNETORESISTIVE RANDOM ACCESS MEMORY DEVICE AND METHOD OF MANUFACTURING THE SAME

(71) Applicants: Ki-Seok Suh, Hwaseong-si (KR); Jae-Chul Shim, Hwaseong-si (KR); Kil-Ho Lee, Busan (KR); Yong-Seok Chung, Seoul (KR); Gwan-Hyeob Koh, Seoul (KR); Yoon-Jong Song, Hwaseong-si (KR)

(72) Inventors: Ki-Seok Suh, Hwaseong-si (KR); Jae-Chul Shim, Hwaseong-si (KR); Kil-Ho Lee, Busan (KR); Yong-Seok Chung, Seoul (KR); Gwan-Hyeob Koh, Seoul (KR); Yoon-Jong Song, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/157,403

(22) Filed: May 17, 2016

(65) Prior Publication Data
US 2017/0069684 A1    Mar. 9, 2017

(30) Foreign Application Priority Data
Sep. 8, 2015  (KR) .......................... 10-2015-0126863

(51) Int. Cl.
*H01L 27/22*  (2006.01)
*H01L 43/12*  (2006.01)

(52) U.S. Cl.
CPC ............ *H01L 27/222* (2013.01); *H01L 43/12* (2013.01)

(58) Field of Classification Search
CPC ................................ H01L 43/08; H01L 43/10
See application file for complete search history.

(56) References Cited

U.S. PATENT DOCUMENTS

| 6,551,852 B2 | 4/2003 | Tuttle |
| 6,785,159 B2 | 8/2004 | Tuttle |
| 6,965,138 B2 | 11/2005 | Nakajima et al. |
| 8,097,911 B2* | 1/2012 | Keller ............... H01L 21/28273 |
| | | 257/316 |
| 8,258,592 B2 | 9/2012 | Matsuda et al. |
| 8,456,893 B2 | 6/2013 | Horng et al. |

(Continued)

FOREIGN PATENT DOCUMENTS

| JP | 2009295737 A | 12/2009 |
| JP | 2013140891 A | 7/2013 |

(Continued)

*Primary Examiner* — Julia Slutsker
(74) *Attorney, Agent, or Firm* — Renaissance IP Law Group LLP

(57) ABSTRACT

A method of manufacturing an MRAM device includes sequentially forming a first insulating interlayer and an etch-stop layer on a substrate. A lower electrode is formed through the etch-stop layer and the first insulating interlayer. An MTJ structure layer and an upper electrode are sequentially formed on the lower electrode and the etch-stop layer. The MTJ structure layer is patterned by a physical etching process using the upper electrode as an etching mask to form an MTJ structure at least partially contacting the lower electrode. The first insulating interlayer is protected by the etch-stop layer so not to be etched by the physical etching process.

19 Claims, 33 Drawing Sheets

(56) References Cited

U.S. PATENT DOCUMENTS

| | | | |
|---|---|---|---|
| 8,492,881 B2 | 7/2013 | Kuroiwa et al. | |
| 9,159,581 B2 * | 10/2015 | Li | H01L 21/31116 |
| 9,236,383 B2 * | 1/2016 | Manning | H01L 27/105 |
| 2003/0119210 A1 | 6/2003 | Yates et al. | |
| 2004/0211749 A1 | 10/2004 | Grynkewich et al. | |
| 2006/0264056 A1 * | 11/2006 | Manning | H01L 27/105 438/740 |
| 2009/0227045 A1 * | 9/2009 | Li | H01L 43/08 438/3 |
| 2009/0302404 A1 | 12/2009 | Matsuda et al. | |
| 2012/0056253 A1 | 3/2012 | Iwayama et al. | |
| 2013/0119494 A1 * | 5/2013 | Li | H01L 43/08 257/421 |
| 2013/0241015 A1 | 9/2013 | Nomachi | |
| 2017/0018704 A1 * | 1/2017 | Chuang | H01L 43/02 |

FOREIGN PATENT DOCUMENTS

| | | |
|---|---|---|
| KR | 100621126 B1 | 9/2006 |
| KR | 101036703 B1 | 5/2011 |

* cited by examiner

MAGNETORESISTIVE RANDOM ACCESS MEMORY DEVICE AND METHOD OF MANUFACTURING THE SAME

CROSS-REFERENCE TO RELATED APPLICATION

This application claims priority under 35 U.S.C. §119 to Korean Patent Application No. 10-2015-0126863, filed on Sep. 8, 2015 in the Korean Intellectual Property Office (KIPO), the contents of which are herein incorporated by reference in their entirety.

BACKGROUND

Example embodiments relate to semiconductor devices and methods of manufacturing the same. More particularly, example embodiments relate to magnetoresistive random access memory (MRAM) devices and methods of manufacturing the same.

When an MRAM device is manufactured, a lower electrode may be formed through an insulating interlayer, and a magnetic tunnel junction (MTJ) structure layer may be formed on the lower electrode and the insulating interlayer. The MTJ structure layer may include a noble metal, and may be patterned by a physical etching process to form an MTJ structure. When the physical etching process is performed, the insulating interlayer and the lower electrode under the MTJ structure layer may be also etched, and elements of the lower electrode may be thus re-deposited on a sidewall of the MTJ structure, which may generate an electrical short.

SUMMARY

Example embodiments provide a method of manufacturing an MRAM device having good characteristics.

Example embodiments provide an MRAM device having good characteristics.

According to example embodiments, there is provided a method of manufacturing an MRAM device. In the method, a first insulating interlayer and an etch-stop layer may be sequentially formed on a substrate. A lower electrode may be formed through the etch-stop layer and the first insulating interlayer. An MTJ structure layer and an upper electrode may be sequentially formed on the lower electrode and the etch-stop layer. The MTJ structure layer may be patterned by a physical etching process using the upper electrode as an etching mask to form an MTJ structure at least partially contacting the lower electrode. The first insulating interlayer may be protected by the etch-stop layer so not to be etched by the physical etching process.

In example embodiments, the etch-stop layer may include a metal oxide, a nitride and/or a ceramic material.

In example embodiments, the metal oxide may include aluminum oxide, magnesium oxide, yttrium oxide and/or erbium oxide.

In example embodiments, the nitride may include boron nitride.

In example embodiments, the ceramic material may include yttrium silicon oxide, zirconium titanium oxide and/or barium titanium oxide.

In example embodiments, the physical etching process may include an ion beam etching (IBE) process.

In example embodiments, the at least a portion of the etch-stop layer may remain on the first insulating interlayer after the physical etching process.

In example embodiments, the MTJ structure may cover the whole upper surface of the lower electrode.

In example embodiments, the MTJ structure may cover a portion of an upper surface of the lower electrode. A recess may be formed at an upper portion of the lower electrode by the physical etching process. A bottom of the recess may not be lower than a lower surface of the etch-stop layer.

In example embodiments, when the lower electrode is formed, a landing pad may be formed through the etch-stop layer and the first insulating interlayer that is spaced apart from the lower electrode.

In example embodiments, when the lower electrode and the landing pad are formed, first and second openings may be formed through the etch-stop layer and the first insulating interlayer. A conductive layer may be formed on the etch-stop layer to fill the first and second openings. The conductive layer may be planarized until an upper surface of the etch-stop layer is exposed.

In example embodiments, upper surfaces of the lower electrode and the landing pad may be substantially coplanar with the upper surface of the etch-stop layer.

In example embodiments, upper surfaces of the lower electrode and the landing pad may be formed at different heights from that of the upper surface of the etch-stop layer.

In example embodiments, a planarization layer may be further formed on the lower electrode, the landing pad and the etch-stop layer. The planarization layer may be etched by the physical etching process to form a planarization pattern under the MTJ structure.

In example embodiments, the planarization layer may include a metal nitride.

In example embodiments, a relatively small amount of an upper portion of the landing pad may be etched when the physical etching process is performed.

In example embodiments, a wiring structure including a via and a first wiring sequentially stacked and integrally formed with each other may be formed. The via may contact an upper surface of the landing pad, and the first wiring may be electrically connected to the upper electrode.

In example embodiments, when the wiring structure is formed, a second insulating interlayer may be formed on the upper electrode, the MTJ structure, the landing pad and the etch-stop layer. The second insulating interlayer may be partially removed to form a via hole exposing the upper surface of the landing pad. The via may be formed to fill the via hole.

In example embodiments, the lower electrode may be formed in a memory cell region, and the landing pad may be formed in a peripheral region.

In example embodiments, both of the lower electrode and the landing pad may be formed in a memory cell region.

In example embodiments, before the first insulating interlayer and the etch-stop layer are sequentially formed on the substrate, a second wiring may be formed on the substrate. The lower electrode may be formed to contact an upper surface of the second wiring.

In example embodiments, when the second wiring is formed on the substrate, a third insulating interlayer may be formed on the substrate. The second wiring and a third wiring may be formed through the third insulating interlayer. When the lower electrode is formed, a landing pad may be formed through the etch-stop layer and the first insulating interlayer that is spaced apart from the lower electrode and contact an upper surface of the third wiring.

In example embodiments, before the first insulating interlayer and the etch-stop layer are sequentially formed, second and third wirings may be formed on the substrate. The lower electrode may contact an upper surface of the second wiring. After the MTJ structure is formed, a wiring structure including a via and a first wiring sequentially stacked and integrally formed with each other may be formed. The via may contact the third wiring, and the first wiring may be electrically connected to the upper electrode.

In example embodiments, the MTJ structure may include a noble metal.

According to example embodiments, there is provided a method of manufacturing an MRAM device. In the method, an insulating interlayer structure including an etch-stop layer may be formed on a substrate. A lower electrode may be formed through the insulating interlayer structure. An MTJ structure layer and an upper electrode may be sequentially formed on the lower electrode and the insulating interlayer structure. The MTJ structure layer may be patterned by a physical etching process using the upper electrode as an etching mask to form an MTJ structure at least partially contacting the lower electrode. A portion of the insulating interlayer structure under the etch-stop layer may be protected by the etch-stop layer so not to be etched by the physical etching process.

In example embodiments, the insulating interlayer structure may include a first insulating interlayer, the etch-stop layer and a second insulating interlayer sequentially stacked. The lower electrode may be formed through the first insulating interlayer, the etch-stop layer and the second insulating interlayer.

In example embodiments, the etch-stop layer may remain on the first insulating interlayer after the physical etching process.

In example embodiments, the etch-stop layer may include a metal oxide, a nitride and/or a ceramic material.

In example embodiments, when the lower electrode is formed, a landing pad may be formed through the insulating interlayer structure that is spaced apart from the lower electrode. An upper portion of the landing pad may be partially etched by the physical etching process, and an upper surface of the landing pad may not be lower than a lower surface of the etch-stop layer.

In example embodiments, a wiring structure including a via and a wiring sequentially stacked and integrally formed with each other may be formed. The via may contact an upper surface of the landing pad, and the wiring may be electrically connected to the upper electrode.

In example embodiments, the insulating interlayer structure may include the etch-stop layer and a first insulating interlayer sequentially stacked on the substrate. The lower electrode may be formed through the first insulating interlayer and the etch-stop layer.

In example embodiments, the insulating interlayer structure may include a first insulating interlayer and the etch-stop layer sequentially stacked on the substrate. The lower electrode may be formed through the etch-stop layer and the first insulating interlayer.

According to example embodiments, there is provided an MRAM device. The MRAM device may include an insulating interlayer structure, a lower electrode, a landing pad, an MTJ structure, an upper electrode and a wiring structure. The insulating interlayer structure may be formed on a substrate, and include a first insulating interlayer and an etch-stop layer sequentially stacked. The lower electrode and the landing pad may be formed through the insulating interlayer structure and spaced apart from each other. The MTJ structure may be formed on the lower electrode. The upper electrode may be formed on the MTJ structure. The wiring structure may include a via and a first wiring sequentially stacked and integrally formed with each other. The via may contact an upper surface of the landing pad, and the first wiring may be electrically connected to the upper electrode. The upper surface of the landing pad may not be lower than a lower surface of the etch-stop layer.

In example embodiments, the etch-stop layer may include a metal oxide, a nitride and/or a ceramic material.

In example embodiments, the upper surface of the landing pad may not be lower than an upper surface of the lower electrode.

In example embodiments, the upper surface of the lower electrode may not be higher than an upper surface of the etch-stop layer.

In example embodiments, the lower electrode may protrude from an upper surface of the insulating interlayer structure.

In example embodiments, the MRAM device may further include an insulation pattern covering an upper sidewall of the lower electrode.

In example embodiments, the upper surface of the landing pad may be lower than an upper surface of the lower electrode.

In example embodiments, the MRAM device may further include second and third wirings between the substrate and the insulating interlayer structure. The second and third wirings may respectively contact bottoms of the lower electrode and the landing pad.

According to example embodiments, there is provided an MRAM device. The MRAM device may include an etch-stop layer structure, a lower electrode, an insulation pattern, a landing pad, an MTJ structure, an upper electrode and a wiring structure. The etch-stop layer structure may be formed on a substrate, and include first and second etch-stop layers sequentially stacked. The lower electrode may be formed through the etch-stop layer structure, and protrude from an upper surface of the etch-stop layer structure. The insulation pattern may cover an upper sidewall of the lower electrode. The landing pad may be formed through the first etch-stop layer. The MTJ structure may be formed on the lower electrode. The upper electrode may be formed on the MTJ structure. The wiring structure may include a via and a wiring sequentially stacked and integrally formed with each other. The via may contact an upper surface of the landing pad, and the wiring may be electrically connected to the upper electrode.

In example embodiments, the first etch-stop layer may include silicon nitride, silicon oxynitride, silicon carbonitride, and/or silicon oxycarbonitride, and the second etch-stop layer may include a metal oxide, a nitride, and/or a ceramic material.

According to example embodiments, there is provided an MRAM device. The MRAM device may include an insulating interlayer, an etch-stop layer, a lower electrode, an insulation pattern, an MTJ structure, an upper electrode and a wiring structure. The insulating interlayer may be formed on a substrate, and contain first and second wirings therein. The etch-stop layer may be formed on the first and second wirings and the insulating interlayer, and at least partially expose an upper surface of the second wiring. The lower electrode may be formed through the etch-stop layer. The lower electrode may contact an upper surface of the first wiring, and protrude from an upper surface of the etch-stop layer structure. The insulation pattern may cover an upper sidewall of the lower electrode. The MTJ structure may be formed on the lower electrode. The upper electrode may be formed on the MTJ structure. The wiring structure may include a via and a third wiring sequentially stacked and integrally formed with each other. The via may contact the exposed upper surface of the second wiring, and the third wiring may be electrically connected to the upper electrode.

In example embodiments, the first to third wirings and the lower electrode may include a metal, and the etch-stop layer may include a metal oxide, a nitride and/or a ceramic material.

According to example embodiments, there is provided an MRAM device. The MRAM device may include a first insulating interlayer, an insulating interlayer structure, a lower electrode, an MTJ structure, an upper electrode and a wiring structure. The first insulating interlayer may be formed on a substrate, and contain first and second wirings therein. The insulating interlayer structure may be formed on the first and second wirings and the first insulating interlayer, and include a second insulating interlayer and an etch-stop layer sequentially stacked. The lower electrode may be formed through the insulating interlayer structure, and contact an upper surface of the first wiring. The lower electrode may be formed through the insulating interlayer structure, and contact an upper surface of the first wiring. The MTJ structure may be formed on the lower electrode. The upper electrode may be formed on the MTJ structure. The wiring structure may include a via and a third wiring sequentially stacked and integrally formed with each other. The via may penetrate through the insulating interlayer structure and contact an upper surface of the second wiring. The third wiring may be electrically connected to the upper electrode.

In example embodiments, an upper surface of the lower electrode may not be higher than an upper surface of the insulating interlayer structure.

In example embodiments, an upper surface of the lower electrode may be higher than an upper surface of the insulating interlayer structure.

In example embodiments, the MRAM device may further including an insulation pattern covering an upper sidewall of the lower electrode.

In example embodiments, the etch-stop layer may include a metal oxide, a nitride and/or a ceramic material.

In a method of manufacture an MRAM device in accordance with example embodiments, an etch-stop layer may be formed on an insulating interlayer so that the insulating interlayer may not be etched, but may be protected in an IBE process for forming an MTJ structure. Thus, a lower electrode of which a sidewall may be covered by the insulating interlayer may not be etched so that elements of the lower electrode may not be re-deposited on the sidewall of the MTJ structure. A landing pad of which a sidewall may be covered by the insulating interlayer may not be etched to have a height similar to that of the lower electrode. Accordingly, a via hole exposing an upper surface of the landing pad may not be relatively deep, and a via may be formed to sufficiently fill the via hole with no void or seam therein.

According to example embodiments, a magnetoresistive random access memory (MRAM) device comprises: a substrate in which the substrate comprises a top surface; a first insulating interlayer may be on the top surface substrate in which the first insulating interlayer may comprise a bottom surface and a top surface that is opposite the top surface, the bottom surface of the first insulating interlayer may be proximate to the top surface of the substrate, and the top surface of the first insulating interlayer may be distal to the top surface of the substrate; at least one first wiring structure may be disposed in the first insulating interlayer in which the at least one first wiring structure may comprise a top surface, and at least a portion of the top surface of the at least one first wiring structure may be at substantially a same level at the top surface of the first insulating interlayer; an etch-stop layer may be on the top surface of the first insulating interlayer in which the etch-stop layer may comprise a bottom surface and a top surface that is opposite the top surface, the bottom surface of the etch-stop layer may be proximate to the top surface of the first insulating interlayer, the top surface of the etch-stop layer may be distal to the top surface of the first insulating interlayer, and the bottom surface of the etch-stop layer may not be higher than the top surface of the at least one first wiring structure; a second insulating interlayer may be on the top surface etch-stop layer in which the second insulating interlayer may comprise a bottom surface and a top surface that is opposite the top surface, the bottom surface of the second insulating interlayer may be proximate to the top surface of the etch-stop layer, and the top surface of the first insulating interlayer may be distal to the top surface of the etch-stop layer; at least one lower electrode may be disposed in the second insulating interlayer in which the at least one lower electrode may extend through the second insulating interlayer and may contact a corresponding first wiring structure; and at least one magnetic tunnel junction (MTJ) structure in which each MTJ structure may be electrically connected to a corresponding to a lower electrode.

In example embodiments, the MRAM device may further comprise a plurality of MTJ structures arranged in an array comprising at least one row and at least one column.

In example embodiments, the etch-stop layer may comprise a metal oxide, a nitride and/or a ceramic material.

In example embodiments, the MRAM device may further comprise: a third insulating interlayer on the top surface of the second insulating interlayer in which the third insulating interlayer may comprise a bottom surface and a top surface that is opposite the top surface, the bottom surface of the third insulating interlayer may be proximate to the top surface of the second insulating interlayer, and the top surface of the third insulating interlayer may be distal to the top surface of the second insulating interlayer; and at least one third wiring structure that may be disposed in the third insulating interlayer in which the at least one third wiring structure may be electrically connected to a corresponding MTJ structure.

In example embodiments, the MRAM device may further comprise at least one landing pad disposed in the first insulating interlayer in which the at least one landing pad may comprise a top surface, and at least a portion of the top surface of the at least one landing pad may be at substantially a same level at the top surface of the first insulating interlayer, and in which the bottom surface of the etch-stop layer may be at substantially a same level as the top surface of the at least one landing pad.

In example embodiments, the at least one landing pad may be electrically connected to a corresponding first wiring structure.

In example embodiments, the MRAM device may further comprise a third insulating interlayer on the top surface of the second insulating interlayer in which the third insulating interlayer may comprise a bottom surface and a top surface that is opposite the top surface, the bottom surface of the third insulating interlayer may be proximate to the top surface of the second insulating interlayer, and the top surface of the third insulating interlayer may be distal to the top surface of the second insulating interlayer; and at least one third wiring structure disposed in the third insulating interlayer in which the at least one third wiring structure may be electrically connected to a corresponding landing pad through the third insulating interlayer.

In example embodiments, the upper surface of at least one landing pad may not be lower than an upper surface of the at least one lower electrode.

In example embodiments, the at least one lower electrode may comprise a top surface that is at substantially a same level of the top surface of the etch-stop layer, and the MRAM device may further comprise at least one planarization pattern on at least a portion of the top surface of a corresponding lower electrode between the top surface of the corresponding lower electrode and the MTJ device.

According to example embodiments, a method to form a magnetoresistive random access memory (MRAM) device comprises: forming a first insulating interlayer on a top surface substrate in which the first insulating interlayer may comprise a bottom surface and a top surface that is opposite the top surface, the bottom surface of the first insulating interlayer may be proximate to the top surface of the substrate, and the top surface of the first insulating interlayer may be distal to the top surface of the substrate; forming at least one first wiring structure in the first insulating interlayer in which the at least one first wiring structure may comprise a top surface, and at least a portion of the top surface of the at least one first wiring structure may be at substantially a same level at the top surface of the first insulating interlayer; forming an etch-stop layer on the top surface of the first insulating interlayer in which the etch-stop layer may comprise a bottom surface and a top surface that is opposite the top surface, the bottom surface of the etch-stop layer may be proximate to the top surface of the first insulating interlayer, the top surface of the etch-stop layer may be distal to the top surface of the first insulating interlayer, and the bottom surface of the etch-stop layer may not be higher than the top surface of the at least one first wiring structure; forming a second insulating interlayer on the top surface etch-stop layer in which the second insulating interlayer may comprise a bottom surface and a top surface that is opposite the top surface, the bottom surface of the second insulating interlayer may be proximate to the top surface of the etch-stop layer, and the top surface of the first insulating interlayer may be distal to the top surface of the etch-stop layer; forming at least one lower electrode disposed in the second insulating interlayer in which the at least one lower electrode may extend through the second insulating interlayer and may contact a corresponding first wiring structure; and forming at least one magnetic tunnel junction (MTJ) structure in which each MTJ structure may be electrically connected to a corresponding to a lower electrode.

In example embodiments, the method may further comprise forming a plurality of MTJ structures that may be arranged in an array comprising at least one row and at least one column.

In example embodiments, the etch-stop layer may comprise a metal oxide, a nitride and/or a ceramic material.

In example embodiments, the method may further comprise: forming a third insulating interlayer on the top surface of the second insulating interlayer in which the third insulating interlayer comprises a bottom surface and a top surface that is opposite the top surface, the bottom surface of the third insulating interlayer may be proximate to the top surface of the second insulating interlayer, and the top surface of the third insulating interlayer may be distal to the top surface of the second insulating interlayer; and forming at least one third wiring structure disposed in the third insulating interlayer in which the at least one third wiring structure may be electrically connected to a corresponding MTJ structure.

In example embodiments, the method may further comprise: forming at least one landing pad disposed in the first insulating interlayer in which the at least one landing pad may comprise a top surface, and at least a portion of the top surface of the at least one landing pad may be at substantially a same level at the top surface of the first insulating interlayer, and in which the bottom surface of the etch-stop layer may be at substantially a same level as the top surface of the at least one landing pad.

In example embodiments, the at least one landing pad may be electrically connected to a corresponding first wiring structure.

In example embodiments, the method may further comprise: forming a third insulating interlayer on the top surface of the second insulating interlayer in which the third insulating interlayer may comprise a bottom surface and a top surface that is opposite the top surface, the bottom surface of the third insulating interlayer may be proximate to the top surface of the second insulating interlayer, and the top surface of the third insulating interlayer may be distal to the top surface of the second insulating interlayer; and forming at least one third wiring structure disposed in the third insulating interlayer in which the at least one third wiring structure may be electrically connected to a corresponding landing pad through the third insulating interlayer.

In example embodiments, the upper surface of at least one landing pad may not be lower than an upper surface of the at least one lower electrode.

In example embodiments, the at least one lower electrode may comprise a top surface that is at substantially a same level of the top surface of the etch-stop layer, and the method may further comprise forming at least one planarization pattern on at least a portion of the top surface of a corresponding lower electrode that may be between the top surface of the corresponding lower electrode and the MTJ device.

BRIEF DESCRIPTION OF THE DRAWINGS

Example embodiments will be more clearly understood from the following detailed description taken in conjunction with the accompanying drawings. FIGS. 1 to 28 represent non-limiting, example embodiments as described herein.

FIGS. 1 to 9 are cross-sectional views depicting stages of a method of manufacturing an MRAM device in accordance with example embodiments;

FIGS. 10 to 14 are cross-sectional views depicting stages of another method of manufacturing an MRAM device in accordance with example embodiments;

FIGS. 15 to 18C are cross-sectional views depicting stages of another method of manufacturing an MRAM device in accordance with example embodiments;

FIGS. 19A to 20C are cross-sectional views depicting stages of another method of manufacturing an MRAM device in accordance with example embodiments;

FIGS. 21 to 23B are cross-sectional views depicting stages of another method of manufacturing an MRAM device in accordance with example embodiments;

FIGS. 24 to 25B are cross-sectional views depicting stages of another method of manufacturing an MRAM device in accordance with example embodiments;

FIGS. 26 to 28 are cross-sectional views depicting stages of another method of manufacturing an MRAM device in accordance with example embodiments;

DESCRIPTION OF EMBODIMENTS

Figure 1:
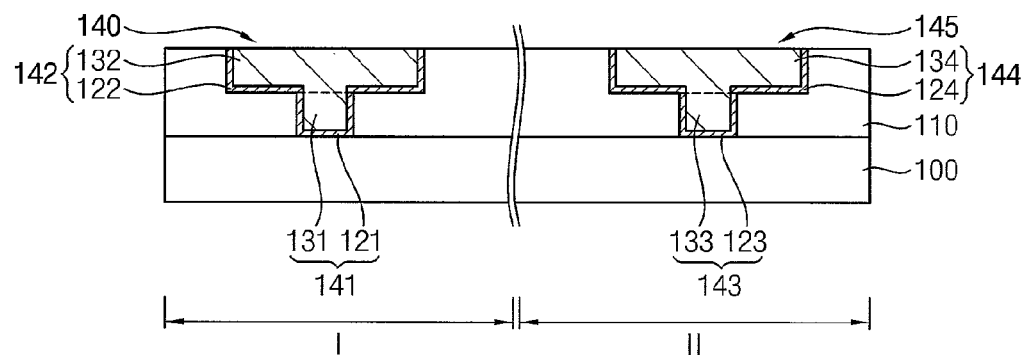

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept or the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 9 are cross-sectional views depicting stages of a method of manufacturing an MRAM device in accordance with example embodiments.

Referring to FIG. 1, a first insulating interlayer 110 may be formed on a substrate 100, and a first wiring structure 140 and a second wiring structure 145 may be formed through the first insulating interlayer 110.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

The substrate 100 may include first and second regions I and II. In example embodiments, the first region I may include the first wiring structure 140, and the second region II may include the second wiring structure 145. In example embodiments, the first region I may serve as a cell region in which memory cells may be formed, and the second region II may serve as a peripheral region in which peripheral circuits may be formed and/or a logic region in which logic devices may be formed.

Various types of elements (not shown), e.g., word lines, transistors, diodes, source/drain layers, contact plugs, wirings, etc., and an insulating interlayer covering the elements may be further formed on the substrate 100. For example, the first wiring structure 140 and the second wiring structure 145 may be formed to contact the contact plugs under the first wiring structure 140 and the second wiring structure 145, and thus may be electrically connected to the source/drain layers on the substrate 100, which may contact the contact plugs.

The first insulating interlayer 110 may be formed of silicon oxide, or a low-k dielectric material having a dielectric constant that is less than the dielectric constant of silicon oxide, i.e., less than about 3.9. For example, the first insulating interlayer 110 may be formed of silicon oxide doped with carbon (SiCOH) or silicon oxide doped with fluorine (F—SiO$_2$), a porous silicon oxide, spin on organic polymer, or an inorganic polymer, e.g., hydrogen silsesquioxane (HSSQ), methyl silsesquioxane (MSSQ), etc.

In example embodiments, the first wiring structure 140 and the second wiring structure 145 may be formed by a dual damascene process or by a single damascene process.

For example, the first wiring structure 140 and the second wiring structure 145 may be formed by a dual damascene process, as follows.

First and second masks (not shown) may be sequentially formed on the first insulating interlayer 110, and an upper portion of the first insulating interlayer 110 may be partially removed using the first and second masks as an etching mask. The first mask may be formed of, e.g., a metal nitride, and the second mask may be formed of, e.g., silicon-on-hardmask (SOH).

After removing the second mask, the first insulating interlayer 110 may be etched with the first mask remaining on the first insulating interlayer 110. Thus, a first via hole (not shown) may be formed through a lower portion of the first insulating interlayer 110 to expose a top surface of the first region I of the substrate 100. A first trench (not shown) may be formed through an upper portion of the first insulating interlayer 110 to be in communication with the first via hole. Additionally, a second via hole (not shown) may be formed through a lower portion of the first insulating interlayer 110 to expose a top surface of the second region II of the substrate 100. A second trench (not shown) may be formed through an upper portion of the first insulating interlayer 110 to be in communication with the second via hole.

A first barrier layer may be formed on the exposed top surfaces of the substrate 100, on the bottoms and sidewalls of the first and second via holes and the first and second trenches, and the first insulating interlayer 110, A first conductive layer may be formed on the first barrier layer to fill remaining portions of the first and second via holes and the first and second trenches. The first conductive layer and the first barrier layer may be planarized until an upper surface of the first insulating interlayer 110 may be exposed to form the first wiring structure 140 and the second wiring structure 145 respectively on the first and second regions I and II of the substrate 100.

The first conductive layer may be formed by forming a seed layer (not shown) on the first barrier layer, and performing an electroplating process.

The first barrier layer may be formed of a metal nitride, e.g., tantalum nitride, titanium nitride, etc., or a metal, e.g., tantalum, titanium, etc. The first conductive layer may be formed of a metal, e.g., tungsten, copper, aluminum, etc.

In example embodiments, the planarization process may be performed by a chemical mechanical polishing (CMP) process and/or an etch-back process. Upper surfaces of the first wiring structure 140 and the second wiring structure 145 may be substantially coplanar with the upper surface of the first insulating interlayer 110. In some example embodiments, the upper surfaces of one or more of the first wiring structure 140 and the second wiring structure 145 may not be coplanar with the upper surface of the first insulating interlayer 110, and in this case, a planarization layer (not shown) may be further formed on the upper surfaces of the first wiring structure 140 and the second wiring structure 145 and the first insulating interlayer 110.

The first wiring structure 140 may include a first via 141 and a first wiring 142, which may be sequentially stacked and integrally formed with each other. The second wiring structure 145 may include a second via 143 and a second wiring 144, which may be sequentially stacked and integrally formed with each other.

The first via 141 may include a first conductive pattern 131 and a first barrier pattern 121 that covers a bottom and a sidewall of the first conductive pattern 131. The second via 143 may include a second conductive pattern 133 and a second barrier pattern 123 that covers a bottom and a sidewall of the second conductive pattern 133. The first wiring 142 may include a third conductive pattern 132 and a third barrier pattern 122 that covers a portion of a bottom and a sidewall of the third conductive pattern 132. The wiring 144 may include a fourth conductive pattern 134 and a fourth barrier pattern 124 that covers a portion of a bottom and a sidewall of the fourth conductive pattern 134.

Figure 2:
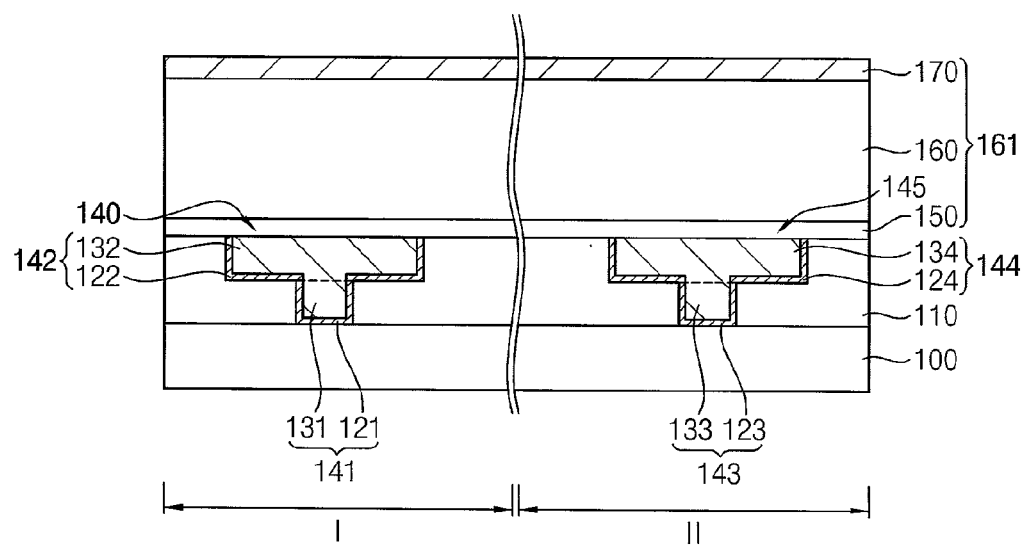

Referring to FIG. 2, a first etch-stop layer 150, a second insulating interlayer 160 and a second etch-stop layer 170 may be sequentially formed on the first wiring structure 140 and the second wiring structure 145, and the first insulating interlayer 110. The sequentially stacked first etch-stop layer 150, the second insulating interlayer 160 and the second etch-stop layer 170 may be referred to as an insulating interlayer structure 161.

The first etch-stop layer 150 may be formed of a nitride, e.g., silicon nitride, silicon oxynitride, silicon carbonitride, silicon oxycarbonitride, etc. The second insulating interlayer 160 may be formed of silicon oxide or a low-k dielectric material. The second etch-stop layer 170 may be formed of a material that may be easily etched by a chemical etching process, e.g., a reactive ion etching (RIE) process. The second etch-stop layer may not, however, be easily etched by a physical etching process, e.g., an ion beam etching (IBE) process.

In particular, the second etch-stop layer 170 may be formed of a metal oxide, a nitride or a ceramic material. For example, the second etch-stop layer 170 may be formed of a metal nitride, such as aluminum oxide, magnesium oxide, yttrium oxide, erbium oxide, etc., a nitride such as boron nitride, or a ceramic material such as yttrium silicon oxide, zirconium titanium oxide, barium titanium oxide, etc.

Figure 3:
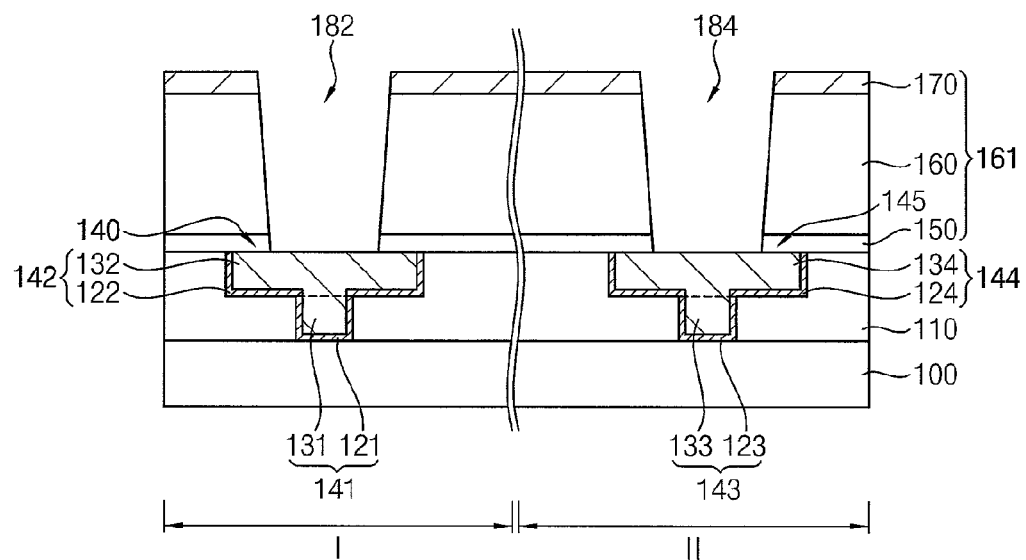

Referring to FIG. 3, the insulating interlayer structure 161 may be partially removed to form first and second openings 182 and 184 exposing the respective upper surfaces of the first wiring structure 140 and the second wiring structure 145, i.e., the respective upper surfaces of the first and second wirings 142 and 144.

In example embodiments, a photoresist pattern (not shown) may be formed on the second etch-stop layer 170, and the insulating interlayer structure 161 may be etched by a dry-etching process using the photoresist pattern as an etching mask to form the first and second openings 182 and 184. The dry-etching process may include a chemical etching process, e.g., an RIE process. Thus, the insulating interlayer structure 161, which includes the second etch-stop layer 170, may be easily etched.

Figure 4:
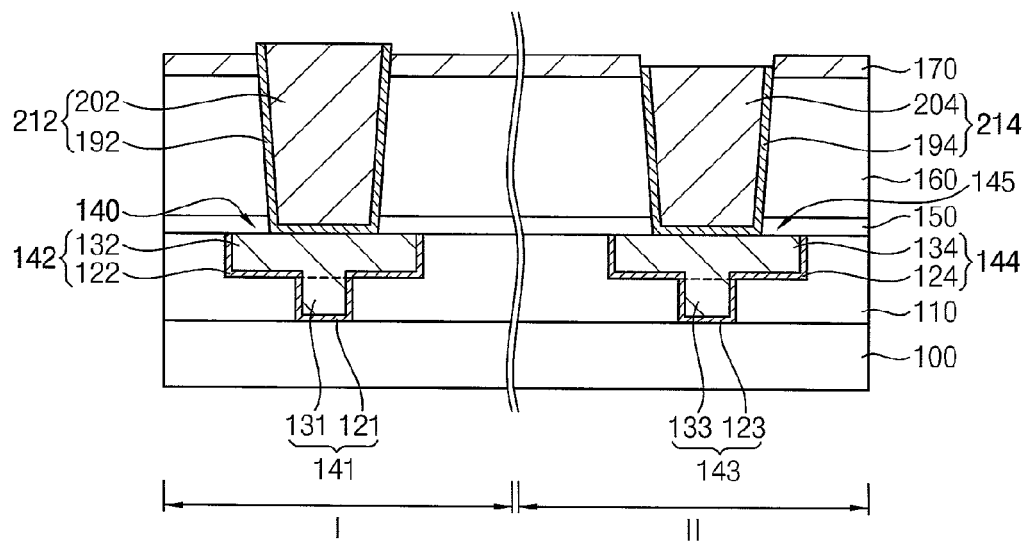

Referring to FIG. 4, a lower electrode 212 and a landing pad 214 may be formed on the first and second regions I and II to respectively fill the first and second openings 182 and 184.

In example embodiments, the lower electrode 212 and the landing pad 214 may be formed by forming a second barrier layer on the exposed upper surfaces of the first and second wirings 142 and 144, on the sidewalls of the first and second openings 182 and 184, and on an upper surface of the second etch-stop layer 170. A second conductive layer may be formed on the second barrier layer to fill remaining portions of the first and second openings 182 and 184. The second conductive layer and the second barrier layer may be planarized until the upper surface of the second etch-stop layer 170 may be exposed.

The second barrier layer may be formed of a metal nitride, e.g., tantalum nitride, titanium nitride, etc., and/or a metal, e.g. tantalum, titanium, etc. The second conductive layer may be formed of a metal, e.g., tungsten, copper, aluminum, etc.

Figure 5A:
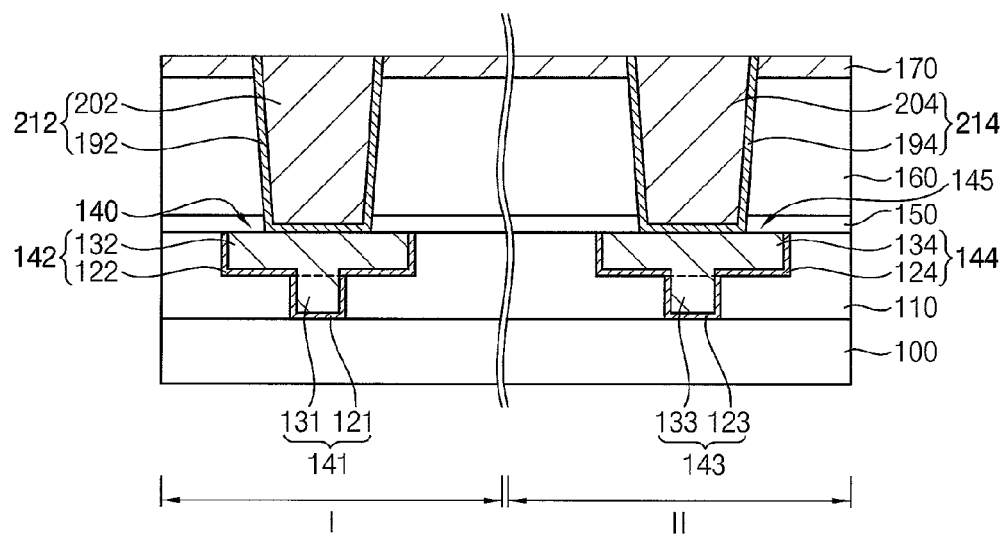
Figure 5B:
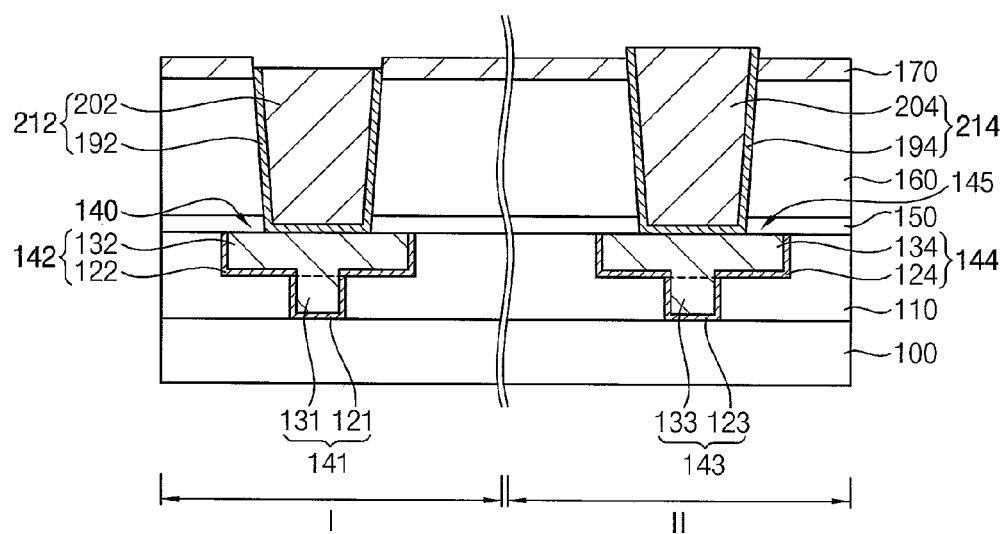

In example embodiments, the planarization process may be performed by a CMP process and/or an etch-back process. In an example embodiment, upper surfaces of the lower electrode 212 and the landing pad 214 may not be formed to be coplanar with the upper surface of the second etch-stop layer 170. FIG. 4 shows that the upper surface of the lower electrode 212 is higher than the upper surface of the second etch-stop layer 170, and that the upper surface of the landing pad 214 is lower than that of the second etch-stop layer 170. Referring to FIG. 5A, in an alternative embodiment, however, the upper surfaces of the lower electrode 212 and the landing pad 214 may be substantially coplanar with the upper surface of the second etch-stop layer 170. Referring to FIG. 5B, in another alternative embodiment, the upper surface of the lower electrode 212 may be lower than the upper surface of the second etch-stop layer 170, and the upper surface of the landing pad 214 may be higher than the upper surface of the second etch-stop layer 170.

That is, the planarization process may be performed until the upper surface of the second etch-stop layer 170 may be exposed, and thus the upper surfaces of the lower electrode 212 and the landing pad 214 may be formed to be substantially coplanar with the upper surface of the second etch-stop layer 170. However, the second conductive layer and/or the second barrier layer that may form the lower electrode 212 and the landing pad 214 and that is removed by the planarization process may have elements that are different from that of the second etch-stop layer 170, which may be also removed by the planarization process. Thus, the second conductive layer and/or the second barrier layer may not have upper surfaces that are substantially coplanar with the upper surface of the second etch-stop layer 170 in an actual planarization process. In particular, when a plurality of lower electrodes 212 and a plurality of landing pads 214 are formed, one or more of the lower electrodes 212 and one or more of the landing pads 214 may have upper surfaces that are substantially coplanar with the upper surface of the second etch-stop layer 170. One or more of the lower electrodes 212 and one or more the landing pads 214 may, however, have upper surfaces that may be located at different heights from the upper surface of the second etch-stop layer 170.

Even if upper surfaces of one or more of the lower electrodes 212 and one or more of the landing pad 214 are located at different heights from the upper surface of the second etch-stop layer 170, the differences the different heights may not be so great, and in an example embodiment, the differences may be less than a thickness of the second etch-stop layer 170.

Hereinafter, for the convenience of explanation, only the case shown in FIG. 4 will be described.

The lower electrode 212 may include a fifth conductive pattern 202 and a fifth barrier pattern 192 that covers a bottom and a sidewall of the fifth conductive pattern 202. The landing pad 214 may include a sixth conductive pattern 204 and a sixth barrier pattern 194 that covers a bottom and a sidewall of the sixth conductive pattern 204.

Figure 6:
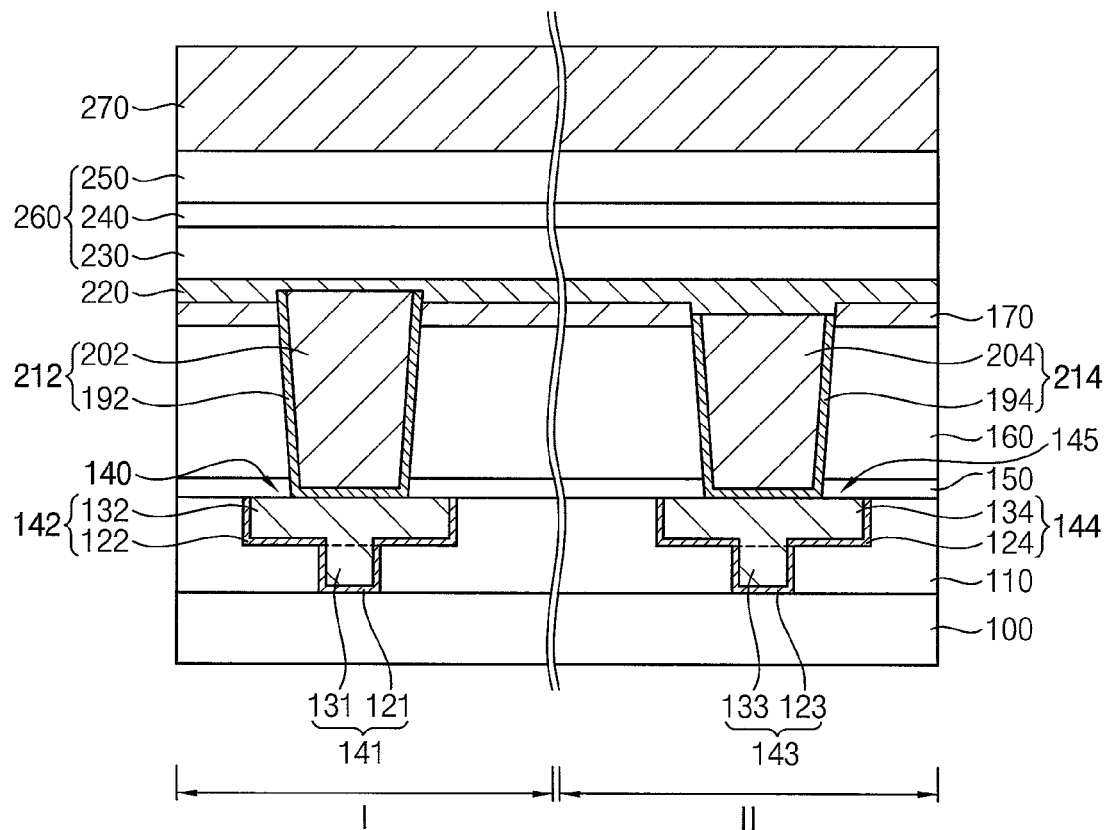

Referring to FIG. 6, a planarization layer 220 may be formed on the lower electrode 212, the landing pad 214 and the second etch-stop layer 170. Layers that will form a magnetic tunnel junction (MTJ) structure layer 260 and an upper electrode layer 270 may be sequentially formed on the planarization layer 220.

The planarization layer 220 may be formed of a conductive metal nitride, e.g., titanium nitride, tantalum nitride, etc. As described above, when the upper surfaces of the lower electrode 212 and the landing pad 214 are formed to be substantially coplanar with the upper surface of the second etch-stop layer 170, the planarization layer 220 may not be formed. That is, the planarization layer 220 may not be needed if the upper surfaces of the lower electrode 212 and the landing pad 214 are formed to be substantially coplanar with the upper surface of the second etch-stop layer 170.

The MTJ structure layer 260 may include a fixed magnetic layer structure 230, a tunnel barrier layer 240 and a free magnetic layer 250 that are sequentially stacked.

In an example embodiment, the fixed magnetic layer structure 230 may include a pinning layer (not shown in FIG. 6), a lower ferromagnetic layer (not shown in FIG. 6), an anti-ferromagnetic coupling spacer layer (not shown in FIG. 6) and an upper ferromagnetic layer (not shown in FIG. 6).

The pinning layer may be formed of, e.g., FeMn, IrMn, PtMn, MnO, MnS, MnTe, $MnF_2$, $FeF_2$, $FeCl_2$, FeO, $CoCl_2$, CoO, $NiCl_2$, NiO and/or Cr. The lower and upper ferromagnetic layers may be formed of, e.g., Fe, Ni and/or Co. The anti-ferromagnetic coupling spacer layer may be formed of, e.g., Ru, Ir and/or Rh.

The tunnel barrier layer 240 may be formed of, e.g., aluminum oxide or magnesium oxide.

The free layer 250 may be formed of, e.g., Fe, Ni and/or Co.

The upper electrode layer 270 may be formed of a metal, e.g., titanium, tantalum, tungsten, etc., and/or a metal nitride, e.g., titanium nitride, tantalum nitride, etc.

Figure 7:
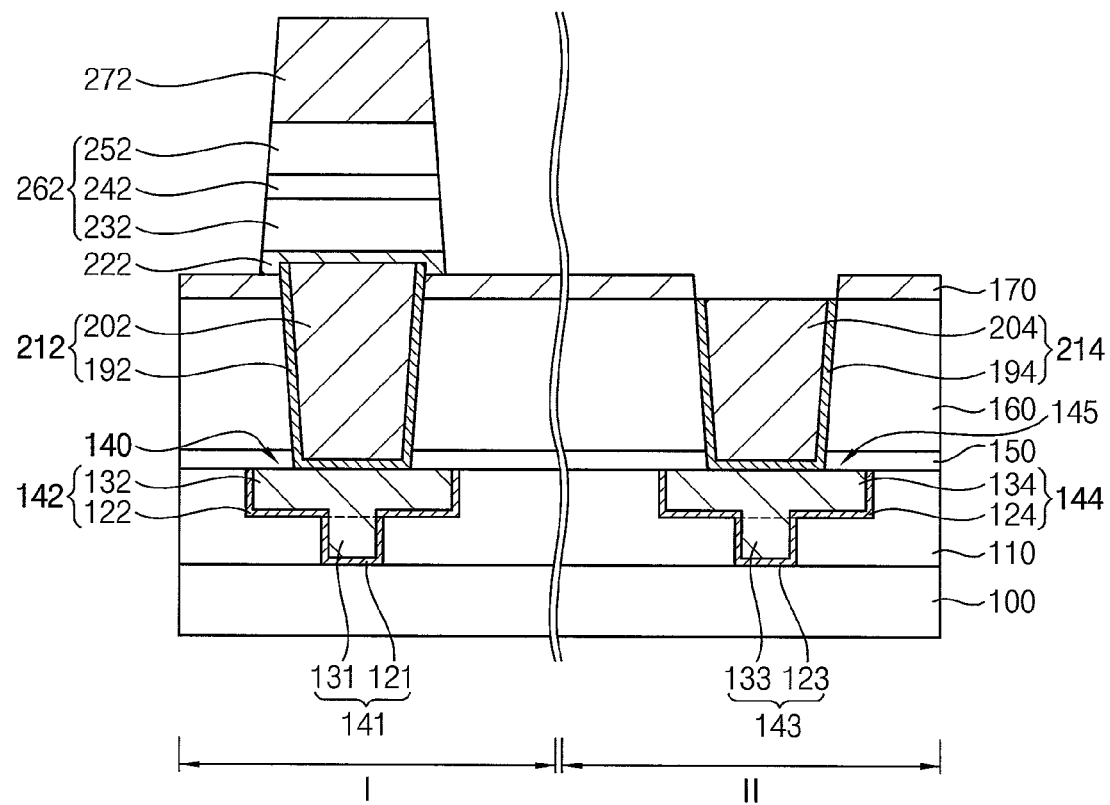

Referring to FIG. 7, a photoresist pattern (not shown) may be formed on the upper electrode layer 270, and the upper electrode layer 270 may be etched using the photoresist pattern as an etching mask to form an upper electrode 272 that may at least partially overlaps the lower electrode 212.

The MTJ structure layer 260 and the planarization layer 220 may be sequentially etched using the upper electrode 272 as an etching mask to form a planarization pattern 222 and an MTJ structure 262 that may be sequentially stacked and may at least partially overlap the lower electrode 212. The MTJ structure 262 may include a fixed magnetic pattern 232, a tunnel barrier pattern 242 and a free magnetic pattern 252 that are sequentially stacked.

FIG. 7 shows that the planarization pattern 222 covers the entire upper surface of the lower electrode 212 and is also formed on a portion of the second etch-stop layer 170, however, the inventive concepts may not be limited thereto. The scope of the inventive concepts may include a situation in which a bottom surface of at least one planarization pattern 222 may be formed to at least partially contact the entire upper surface of the lower electrode 212. That is, the bottom surface of at least one planarization pattern 222 may cover only a portion of the upper surface of the lower electrode 212. Example embodiments in which the planarization pattern 222 does not cover the entire upper surface of the lower electrode 212 will be described later.

In example embodiments, the etching process may include a physical etching process, e.g., an IBE process. The second etch-stop layer 170 may include a material that may not be easily etched by the IBE process, and thus may remain after the etching process is performed. Thus, the second insulating interlayer 160, which is under the second etch-stop layer 170, may be protected by the second etch-stop layer 170 so not to be etched in the etching process. The lower electrode 212, which is covered by the second insulating interlayer 160, may not be etched either.

The landing pad 214, which has been exposed by removing the planarization layer 220, may hardly be etched because the second insulating interlayer 160, which covers a sidewall of the landing pad 214 and the second etch-stop layer 170 on the second insulating interlayer 160, may remain. Even if an upper portion of the landing pad 214 that has been exposed by the etching process may be partially etched, the amount of the landing pad 214 that may be etched in the etching process may be relatively small, and the upper surface of the remaining landing pad 214 may not be lower than an upper surface of the second insulating interlayer 160. That is, a height of the upper surface of the landing pad 214 may be substantially coplanar with or lower than the height of the upper surface of the lower electrode 212 by a small amount.

Figure 8:
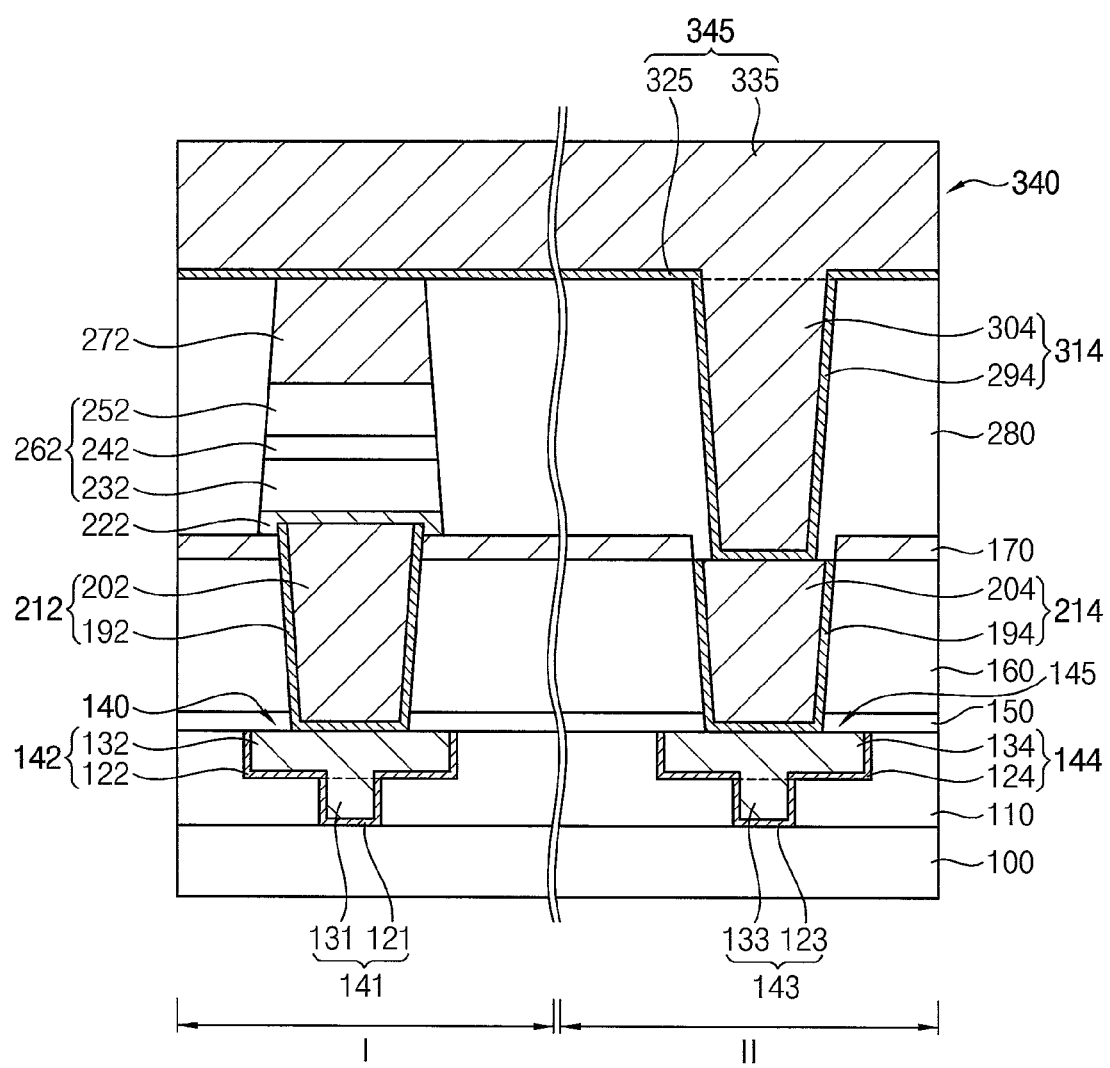

Referring to FIG. 8, a third insulating interlayer 280 may be formed on the upper electrode 272, the MTJ structure 262, the planarization pattern 222, the second etch-stop layer 170 and the landing pad 214. A third wiring structure 340 may be formed through the third insulating interlayer 280 to commonly contact upper surfaces of the landing pad 214 and the upper electrode 272.

The third insulating interlayer 280 may be formed of, e.g., silicon oxide or a low-k dielectric material, and the third wiring structure 340 may be formed by a dual damascene process.

In particular, third and fourth masks (not shown) may be sequentially formed on the third insulating interlayer 280, and an upper portion of the third insulating interlayer 280 may be partially removed using the third and fourth masks as an etching mask. After removing the fourth mask, the third insulating interlayer 280 may be etched with the third mask remaining on the third insulating interlayer 280. Thus, a third via hole (not shown) may be formed through a lower portion of the third insulating interlayer 280 to expose the upper surface of the landing pad 214. A third trench (not shown) may be formed through an upper portion of the third insulating interlayer 280 to be in communication with the third via hole and to contact the upper surface of the upper electrode 272.

Since the landing pad 214 may be formed on the second wiring structure 145 and keep an original height thereof in the previous etching process, the third via hole may not be formed to be relatively deep.

A third barrier layer may be formed on the exposed upper surfaces of the landing pad 214 and the upper electrode 272, on the bottoms and sidewalls of the third via hole and the third trench, and on the third insulating interlayer 280. A third conductive layer may be formed on the third barrier layer to fill remaining portions of the third via hole and the third trench. The third conductive layer and the third barrier layer may be planarized until an upper surface of the third insulating interlayer 280 may be exposed to form the third wiring structure 340.

The third conductive layer may be formed by forming a seed layer (not shown) on the third barrier layer, and by performing an electroplating process. As described above, the third via hole may not be relatively deep, and thus the third conductive layer may be formed to sufficiently fill the third via hole, and no voids and/or seams may be formed in the third via hole.

The third barrier layer may be formed of a metal nitride, e.g., tantalum nitride, titanium nitride, etc., and/or a metal, e.g., tantalum, titanium, etc. The third conductive layer may be formed of a metal, e.g., tungsten, copper, aluminum, etc.

In example embodiments, the planarization process may be performed by a CMP process and/or an etch-back process.

The third wiring structure 340 may include a third via 314 and a third wiring 345, which may be sequentially stacked and integrally formed with each other. The third via 314 may include a seventh conductive pattern 304 and a seventh barrier pattern 294 that covers a bottom and a sidewall of the seventh conductive pattern 304. The third wiring 345 may include an eighth conductive pattern 335 and an eighth barrier pattern 325 that covers a portion of a bottom and a sidewall of the eighth conductive pattern 335.

The MRAM device according to the subject matter disclosed herein may be manufactured by the above processes.

As described above, the second etch-stop layer 170 may be formed on the second insulating interlayer 160 so that the second insulating interlayer 160 may not be etched, but protected in the IBE process that forms the MTJ structure 262. Thus, a sidewall of the lower electrode 212 that may be covered by the second insulating interlayer 160 may not be etched so that the elements of the lower electrode 212 may not be redeposited on the sidewall of the MTJ structure 262. A sidewall of the landing pad 214 that may be covered by the second insulating interlayer 160 may not be etched to have a height that is similar to that of the lower electrode 212. Accordingly, the third via hole exposing the upper surface of the landing pad 214 may not be relatively deep, and the third via 314 may be formed to sufficiently fill the third via hole with no voids and/or seams therein.

Figure 9:
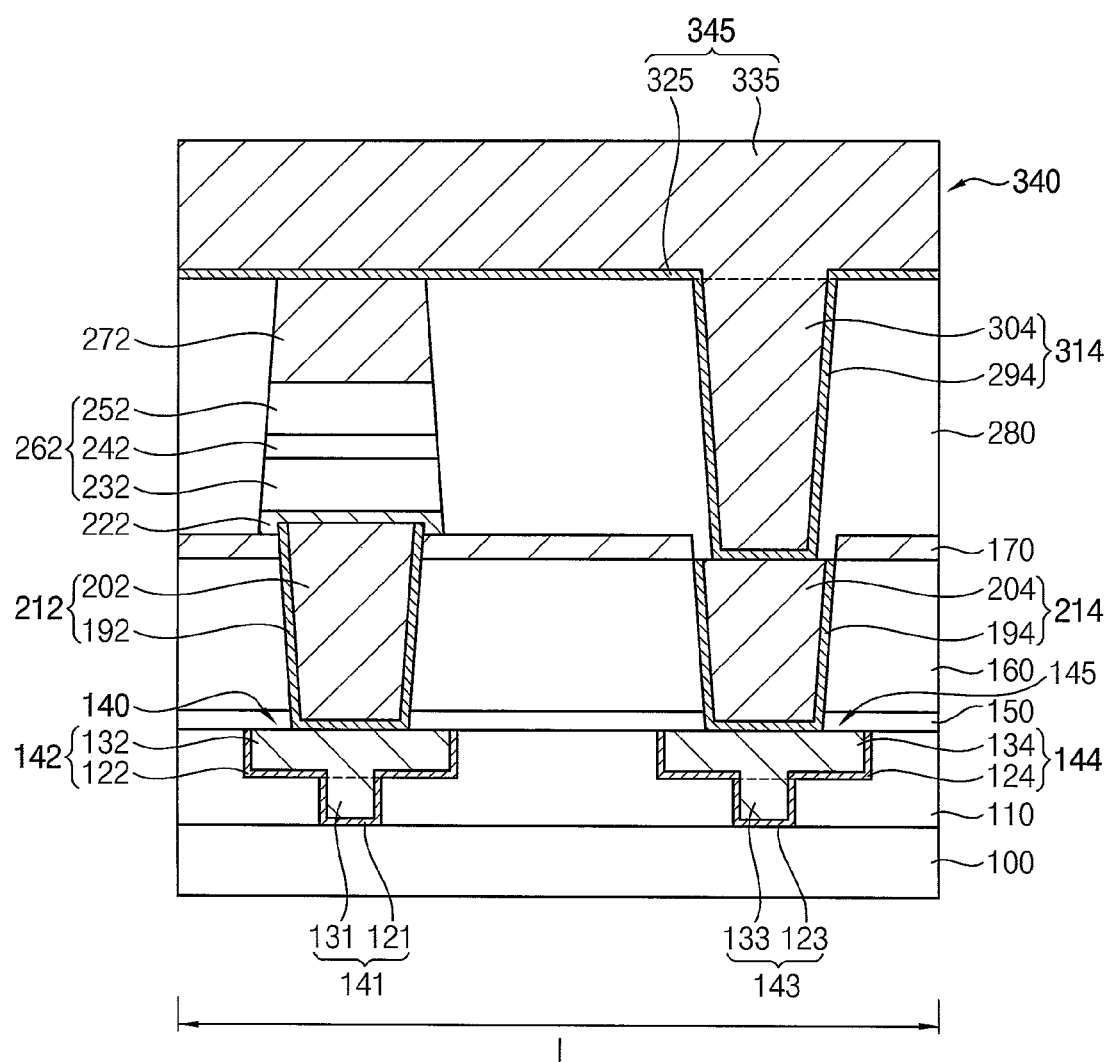

FIG. 9 shows that not only the lower electrode, 212 but also a landing pad 214 may be formed on a first region I of the substrate 100. That is, the inventive concepts may not be limited to a landing pad 214 on the peripheral region or the logic region of the substrate 100, and may include a landing pad 214 together with the lower electrode 212 on the cell region of the substrate 100.

FIGS. 10 to 14 are cross-sectional views depicting stages of another method of manufacturing an MRAM device in accordance with example embodiments. This method may include processes substantially the same as or similar to those described with reference to FIGS. 1 to 9. Thus, like reference numerals refer to like elements, and detailed descriptions about like elements may be omitted below in the interest of brevity.

Figure 10:
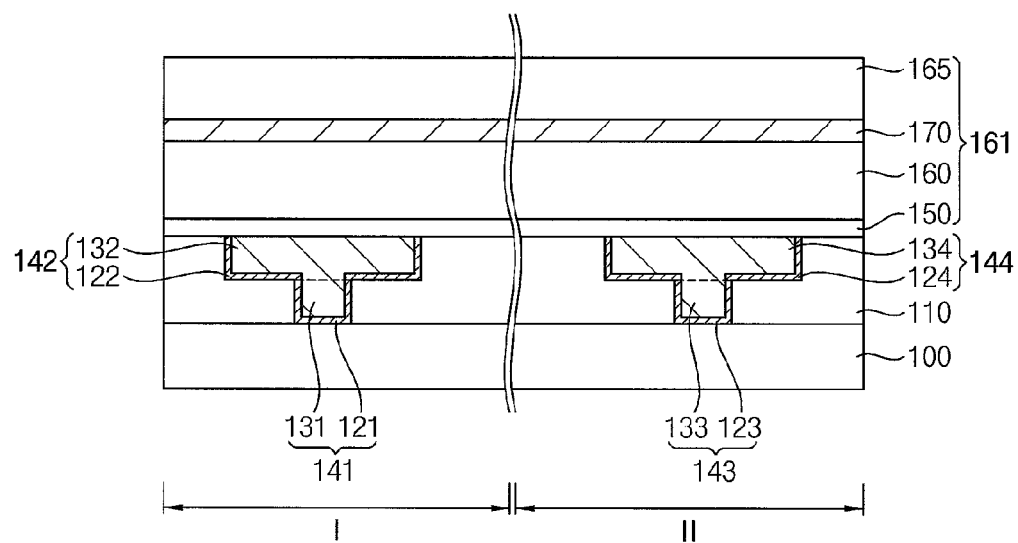

Referring to FIG. 10, processes that are substantially the same as or similar to those described with reference to FIGS. 1 and 2 may be performed.

However, a fourth insulating interlayer 165 may be further formed on the second etch-stop layer 170. The first etch-stop layer 150, the second insulating interlayer 160, the second etch-stop layer 170 and the fourth insulating interlayer 165 sequentially stacked may form an insulating interlayer structure 161.

In example embodiments, the insulating interlayer structure 161 may have a thickness that is substantially equal or similar to a thickness of the insulating interlayer structure 161 shown in FIG. 2. Thus, the thickness of the insulating interlayer structure 161 may be less than that of the second insulating interlayer 160.

Figure 11:
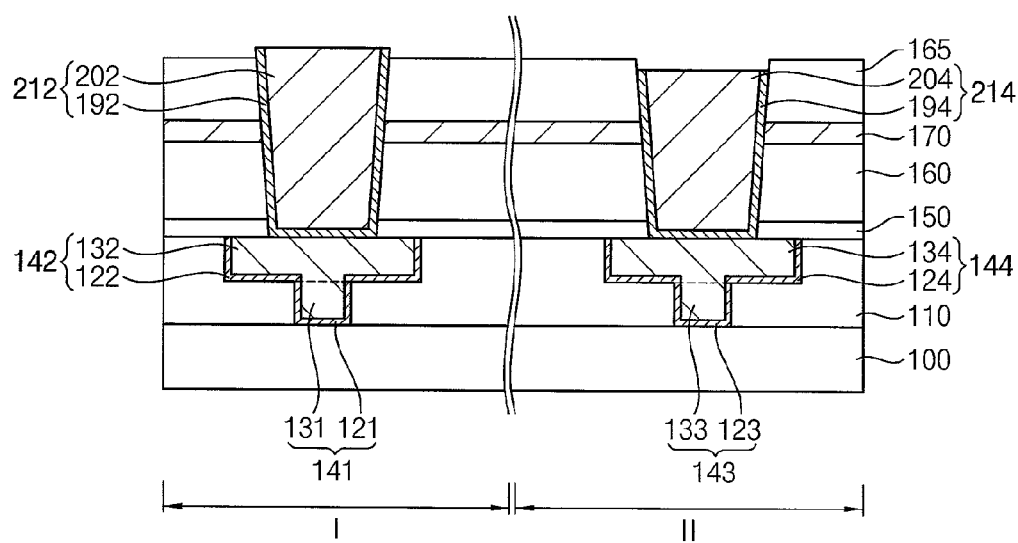

Referring to FIG. 11, processes that are substantially the same as or similar to those described with reference to FIGS. 3 to 5 may be performed.

The lower electrode 212 and the landing pad 214 may be formed through the sequentially stacked first etch-stop layer 150, the second insulating interlayer 160, the second etch-stop layer 170 and the fourth insulating interlayer 165. Upper surfaces of the lower electrode 212 and the landing pad 214 may be formed to be substantially coplanar with, lower or higher by a small amount than the upper surface of the fourth insulating interlayer 165.

Figure 12:
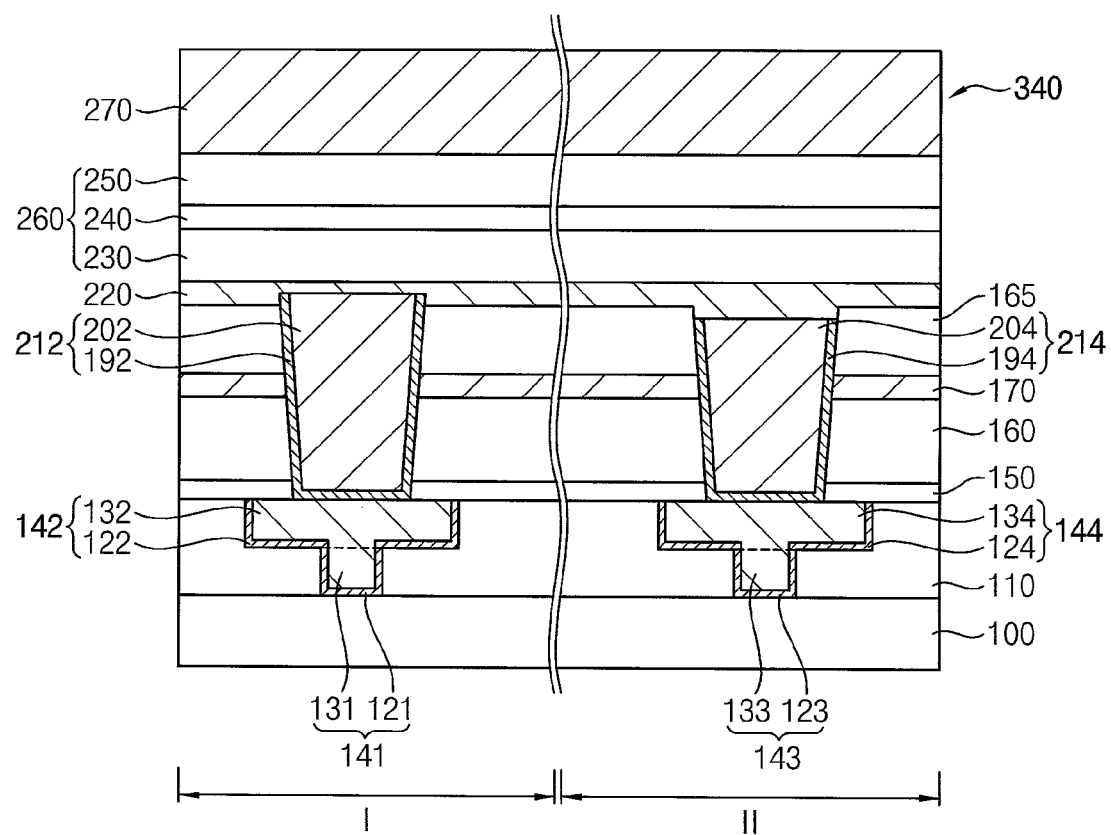

Referring to FIG. 12, a process that is substantially the same as or similar to that described with reference to FIG. 6 may be performed.

Thus, the planarization layer 220 may be formed on the lower electrode 212, the landing pad 214 and the fourth insulating interlayer 165. The MTJ structure layer 260 and the upper electrode layer 270 may be sequentially formed on the planarization layer 220.

Figure 13:
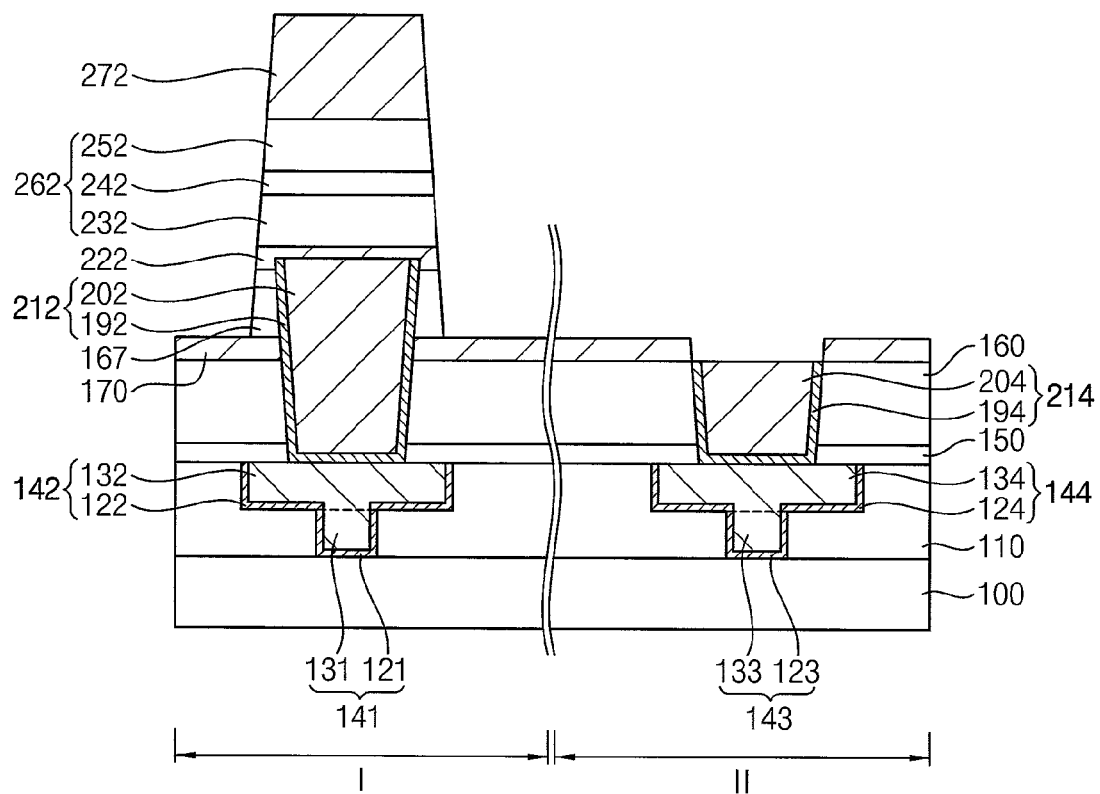

Referring to FIG. 13, a process that is substantially the same as or similar to that described with reference to FIG. 7 may be performed.

Thus, the MTJ structure layer 260 and the planarization layer 220 may be sequentially etched using the upper electrode 272 as an etching mask to form the planarization pattern 222 and the MTJ structure 262 that may be sequentially stacked. The planarization pattern 222 and the MTJ structure 262 may at least partially overlap the lower electrode 212.

The fourth insulating interlayer 165 may, however, be also etched in the etching process, and thus all portions of the fourth insulating interlayer 165 except a portion thereof under the planarization pattern 222 may be removed. As shown in FIG. 13, when the planarization pattern 222 covers the whole upper surface of the lower electrode 212, the remaining portion of the fourth insulating interlayer 165 may cover a sidewall of the lower electrode 212, which may be referred to as an insulation pattern 167.

Since the second etch-stop layer 170 may remain on the second insulating interlayer 160, the second insulating interlayer 160 may not be removed in the etching process. Thus, a sidewall of the lower electrode 212 may be covered by the insulation pattern 167, the second etch-stop layer 170 and the second insulating interlayer 160 and not be etched in the etching process.

The landing pad 214 may be partially removed because most of the fourth insulating interlayer 165 may be removed. At least a portion of the landing pad 214 that is covered by the second insulating interlayer 160 may not, however, be removed, but remains. That is, an upper surface of the landing pad 214 may not be lower than a lower surface of the second etch-stop layer 170 or an upper surface of the second insulating interlayer 160, and may keep the original height of the upper surface of the landing pad 214. Accordingly, the landing pad 214 may be formed to have a desired height by controlling the thicknesses of the second insulating interlayer 160, the second etch-stop layer 170 and/or the fourth insulating interlayer 165.

Figure 14:
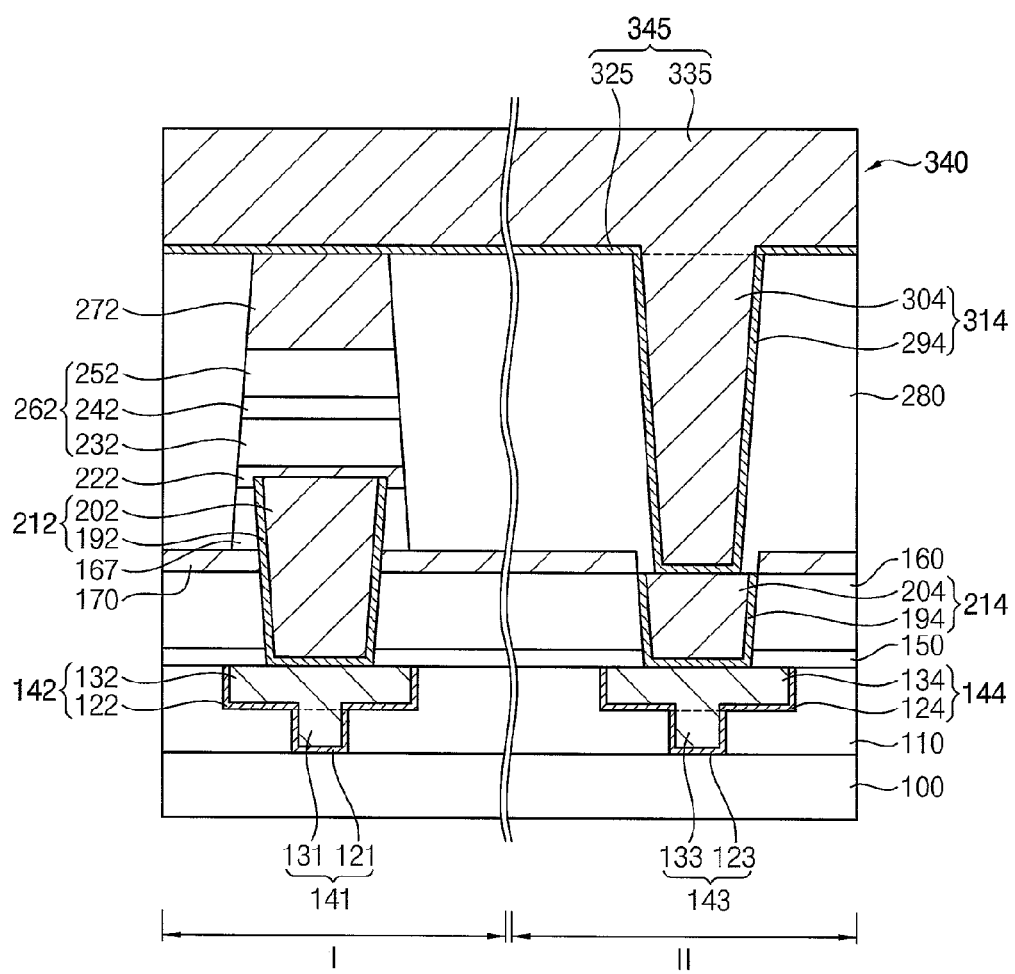

Referring to FIG. 14, a process that is substantially the same as or similar to that described with reference to FIG. 8 may be performed.

Thus, the third insulating interlayer 280 may be formed on the upper electrode 272, the MTJ structure 262, the planarization pattern 222, the insulation pattern 167, the second etch-stop layer 170 and the landing pad 214. The third wiring structure 340 may be formed through the third insulating interlayer 280 to commonly contact upper surfaces of the landing pad 214 and the upper electrode 272.

Since the landing pad 214 having the desired height may be formed on the second wiring structure 145, the third via 314 of the third wiring structure 340 contacting the upper surface of the landing pad 214 may have good characteristics with no voids and/or seams therein.

FIGS. 15 to 18 are cross-sectional views depicting stages of another method of manufacturing an MRAM device in accordance with example embodiments. This method may include processes that are substantially the same as or similar to those described with reference to FIGS. 1 to 9. Thus, like reference numerals refer to like elements, and detailed descriptions of like elements may be omitted below in the interest of brevity.

Figure 15:
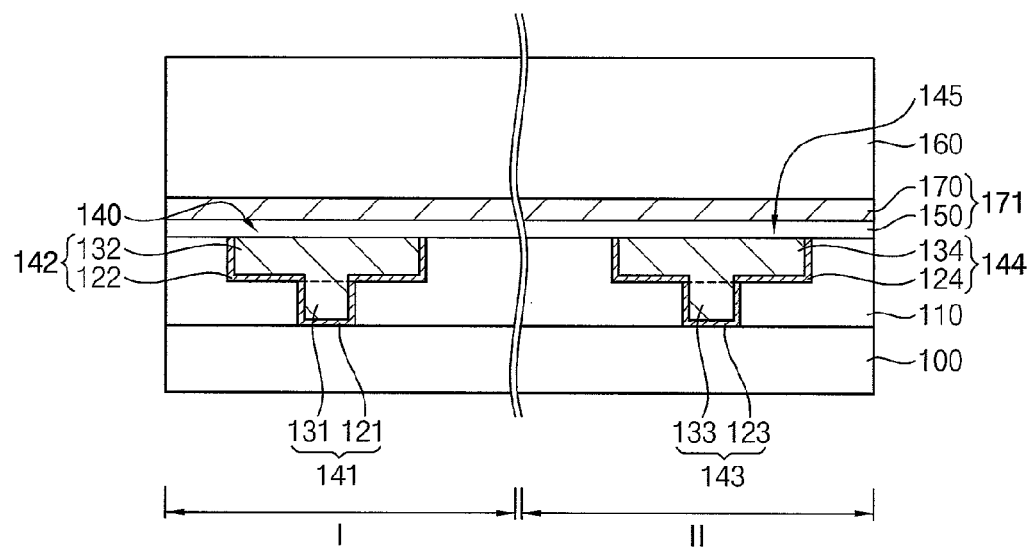

Referring to FIG. 15, processes that are substantially the same as or similar to those described with reference to FIGS. 1 and 2 may be performed.

However, the first etch-stop layer 150, the second etch-stop layer 170 and the second insulating interlayer 160 may, however, be sequentially formed on the first wiring structure 140 and the second wiring structure 145 and the first insulating interlayer 110. Thus, the sequentially stacked first and second etch-stop layers 150 and 170 may form an etch-stop layer structure 171.

Figure 16:
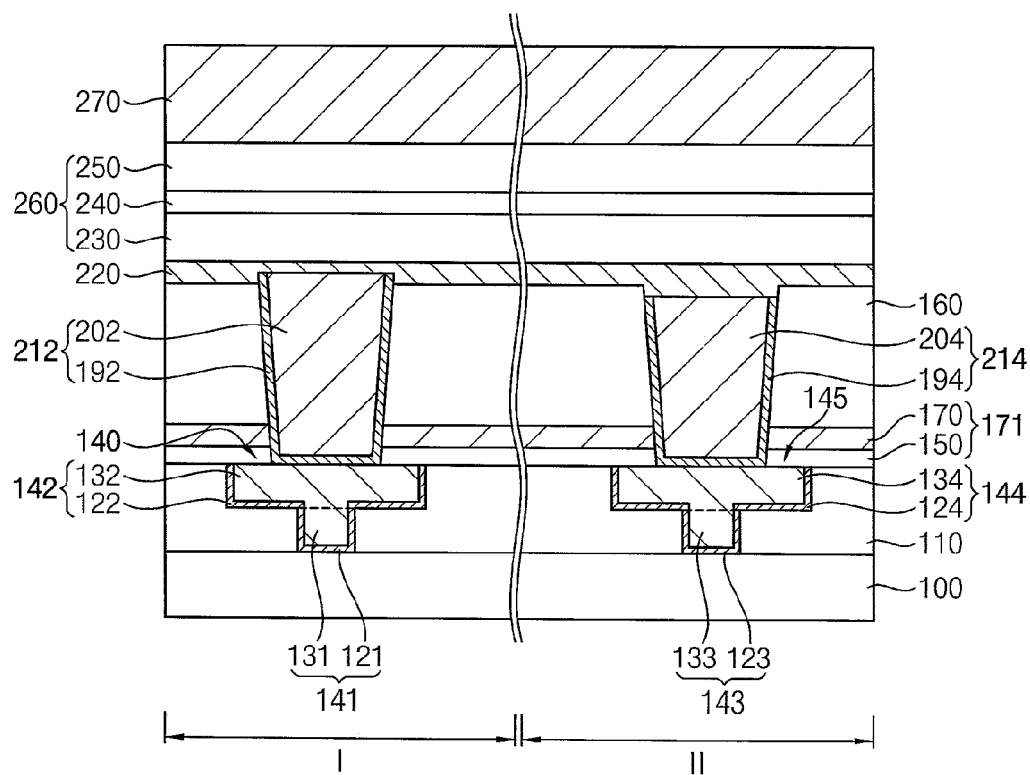

Referring to FIG. 16, processes that are substantially the same as or similar to those described with reference to FIGS. 3 to 6 may be performed.

Thus, the lower electrode 212 and the landing pad 214 may be formed through the first etch-stop layer 150, the second etch-stop layer 170 and the second insulating interlayer 160. Upper surfaces of the lower electrode 212 and the landing pad 214 may be formed to be substantially coplanar with, lower than or higher than the second insulating interlayer 160 by a small amount.

The planarization layer 220 may be formed on the lower electrode 212, the landing pad 214 and the second insulating interlayer 160. The MTJ structure layer 260 and the upper electrode layer 270 may be sequentially formed on the planarization layer 220.

Figure 17A:
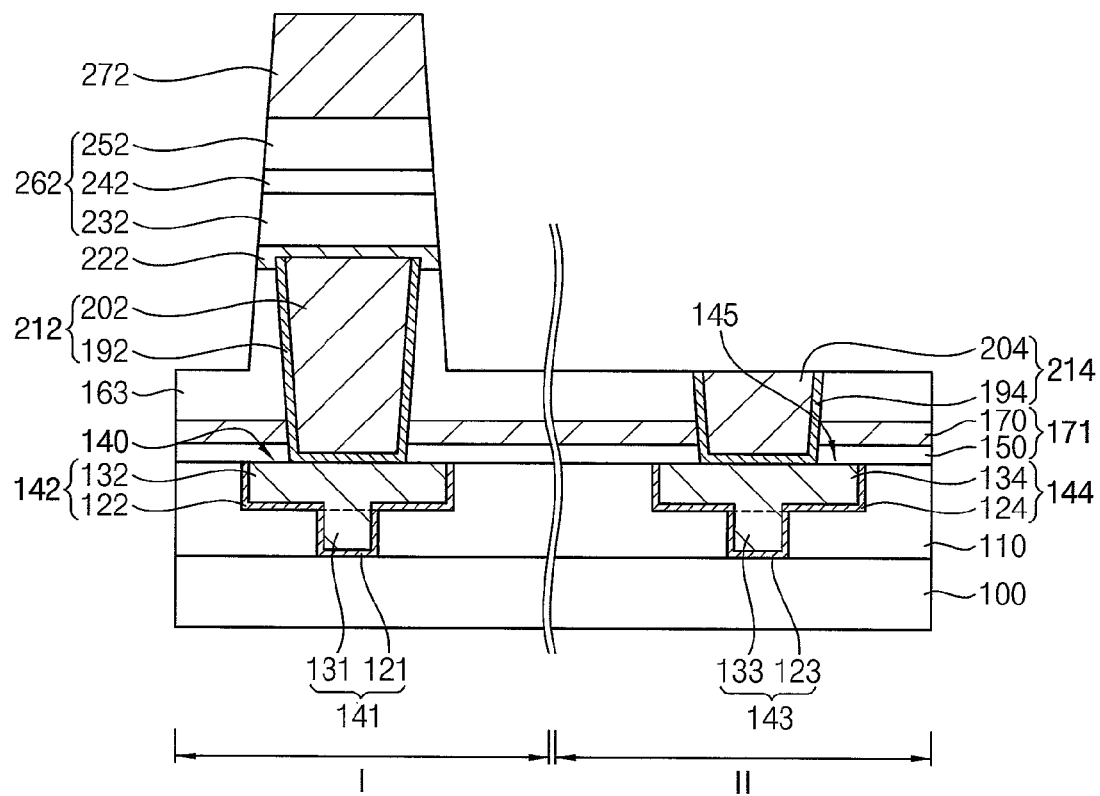

Referring to FIG. 17A, a process that is substantially the same as or similar to that described with reference to FIG. 7 may be performed.

Thus, the MTJ structure layer 260 and the planarization layer 220 may be sequentially etched using the upper electrode 272 as an etching mask to form the planarization pattern 222. The MTJ structure 262 that may be sequentially stacked and at least partially overlap the lower electrode 212.

However, the second insulating interlayer 160 may be also etched in the etching process. That is, the MTJ structure layer 260 may be patterned by an IBE process, and since the second insulating interlayer 160, which is under the planarization layer 220, may be easily etched by the IBE process, an upper portion of the second insulating interlayer 160 may also be etched and transformed into a second insulating interlayer pattern 163.

As the upper portion of the second insulating interlayer 160 is removed, a portion of the landing pad 214 that is covered by the upper portion of the second insulating interlayer 160 may be also removed. Thus, an upper surface of the remaining landing pad 214 may have a height that is lower than the original height.

Figure 17B:
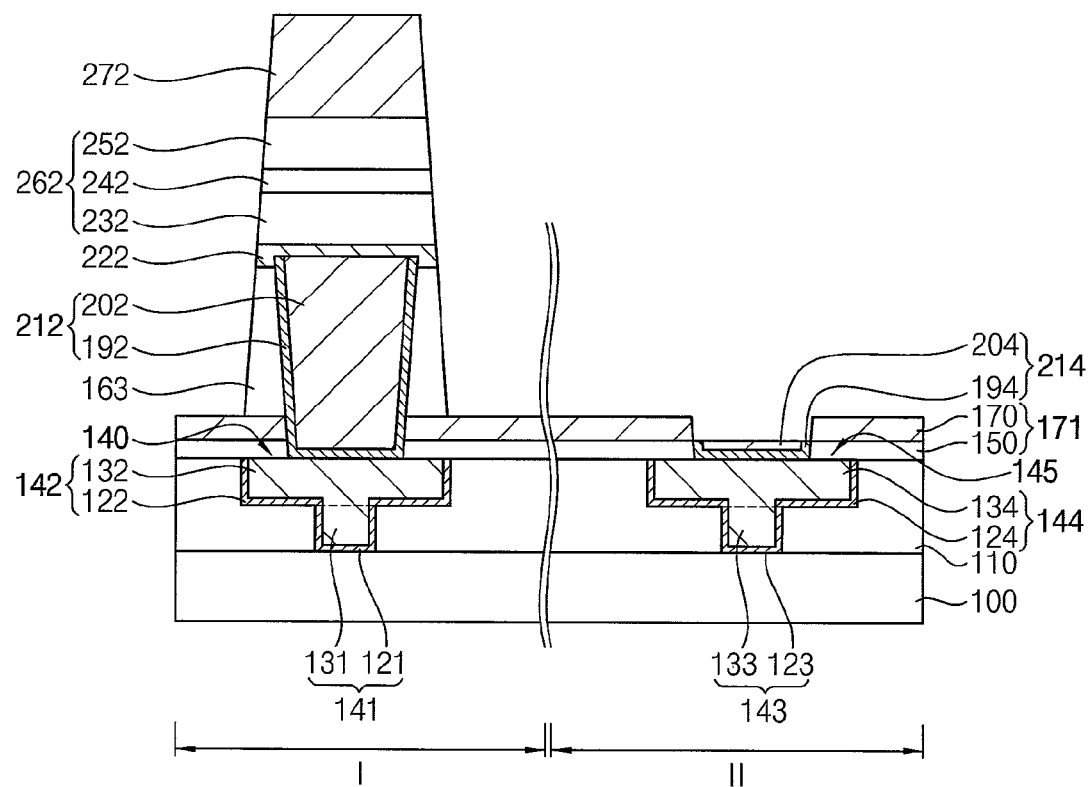

Referring to FIG. 17B, when the IBE process is performed for a relatively long time, most of the second insulating interlayer 160 may be removed except for a portion of the second insulating interlayer 160 under the planarization pattern 222. Thus, an upper surface of the landing pad 214 may have a relatively small height.

However, even in this case, since the second etch-stop layer 170 may remain, at least the underlying first etch-stop layer 150 and the first wiring structure 140 and the second wiring structure 145 that are covered by the first etch-stop layer 150 may not be exposed to the etch.

Figure 18A:
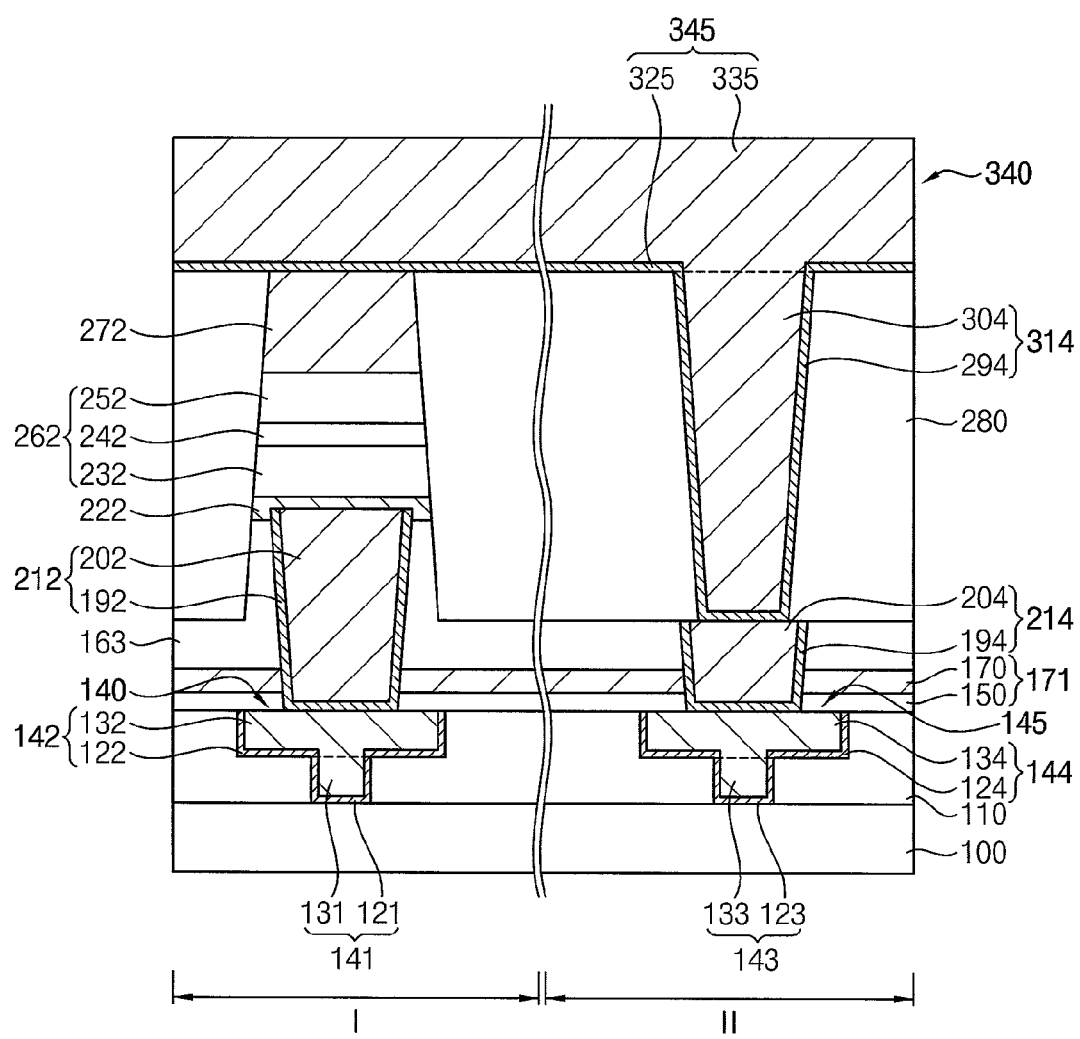

Referring to FIG. 18A, a process that is substantially the same as or similar to that described with reference to FIG. 8 may be performed to complete the MRAM device.

Thus, the third insulating interlayer 280 may be formed on the upper electrode 272, the MTJ structure 262, the planarization pattern 222, the second insulating interlayer pattern 163, and the landing pad 214. The third wiring structure 340 may be formed through the third insulating interlayer 280 to commonly contact upper surfaces of the landing pad 214 and the upper electrode 272.

Figure 18B:
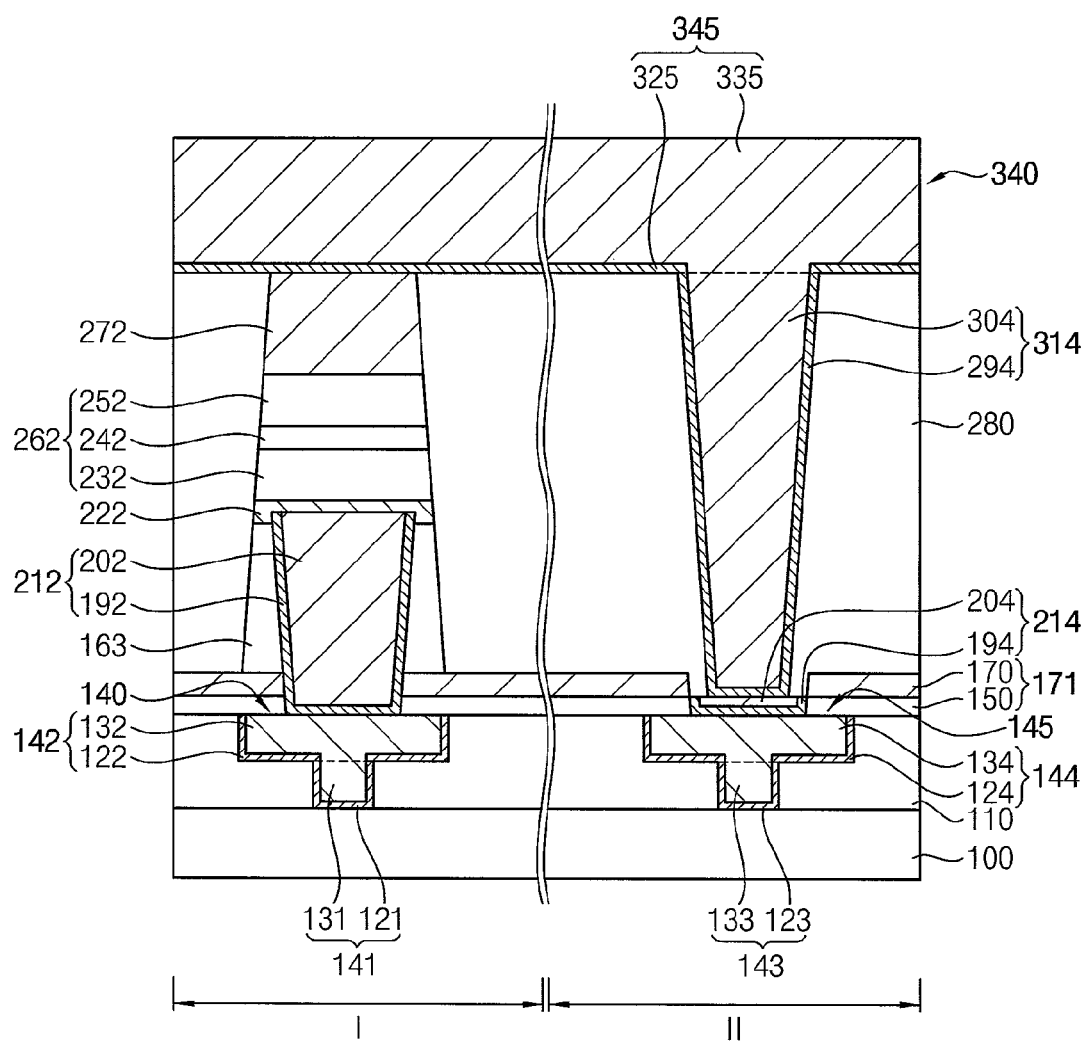

FIG. 18B shows a resultant structure after performing the above process on the structure shown in FIG. 17B.

Figure 18C:
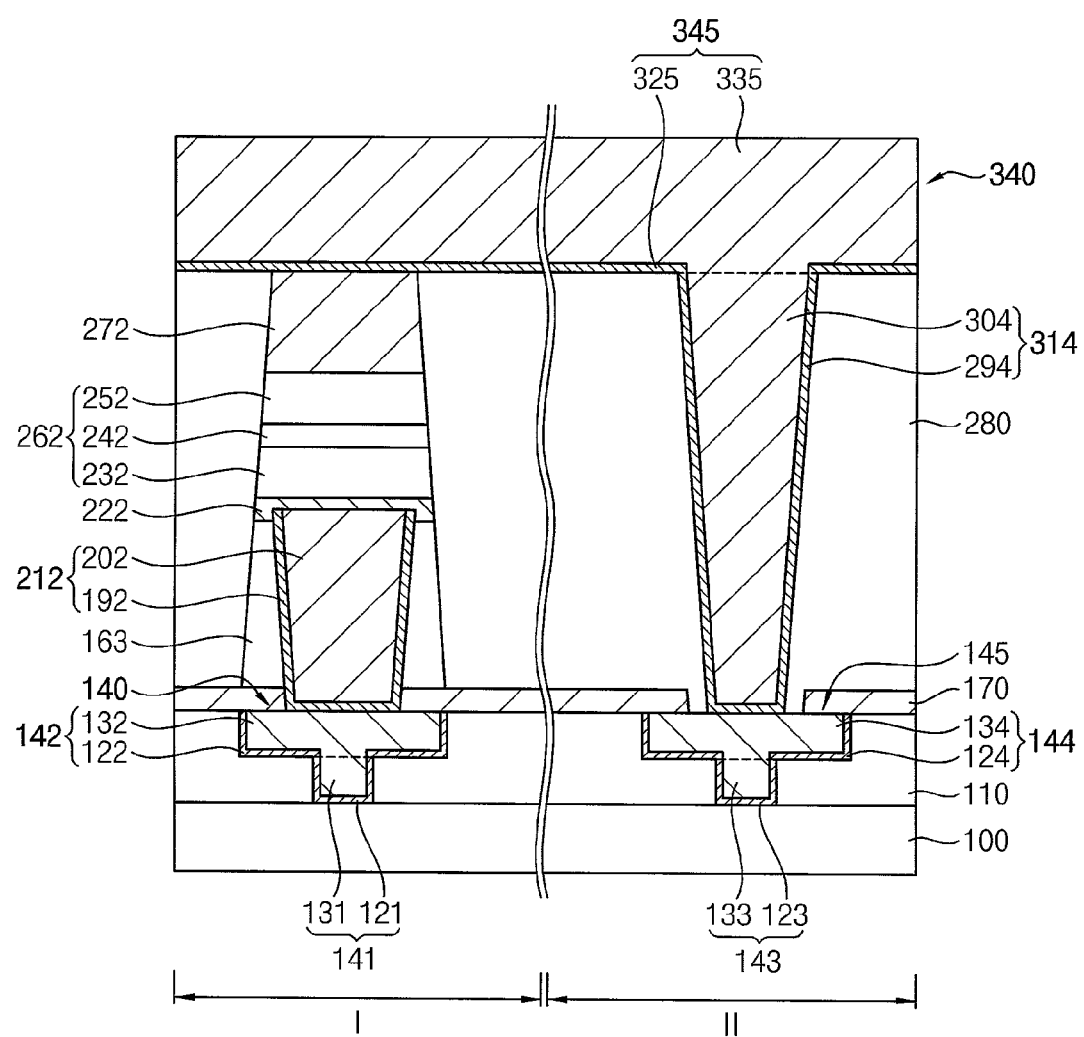

FIG. 18C shows a resultant structure after the above process when the first etch-stop layer 150 described with reference to FIG. 15 is not formed.

That is, the second etch-stop layer 170 and the second insulating interlayer 160 may be sequentially formed on the first wiring structure 140 and the second wiring structure 145 and the first insulating interlayer 110. The first wiring structure 140 and the second wiring structure 145 may be protected by the second etch-stop layer 170 so not to be exposed or etched by the IBE process.

FIGS. 19 to 20 are cross-sectional views depicting stages of another method of manufacturing an MRAM device in accordance with example embodiments. This method may include processes substantially the same as or similar to those described with reference to FIGS. 1 to 9. Thus, like reference numerals refer to like elements, and detailed descriptions of like elements may be omitted below in the interest of brevity.

Figure 19A:
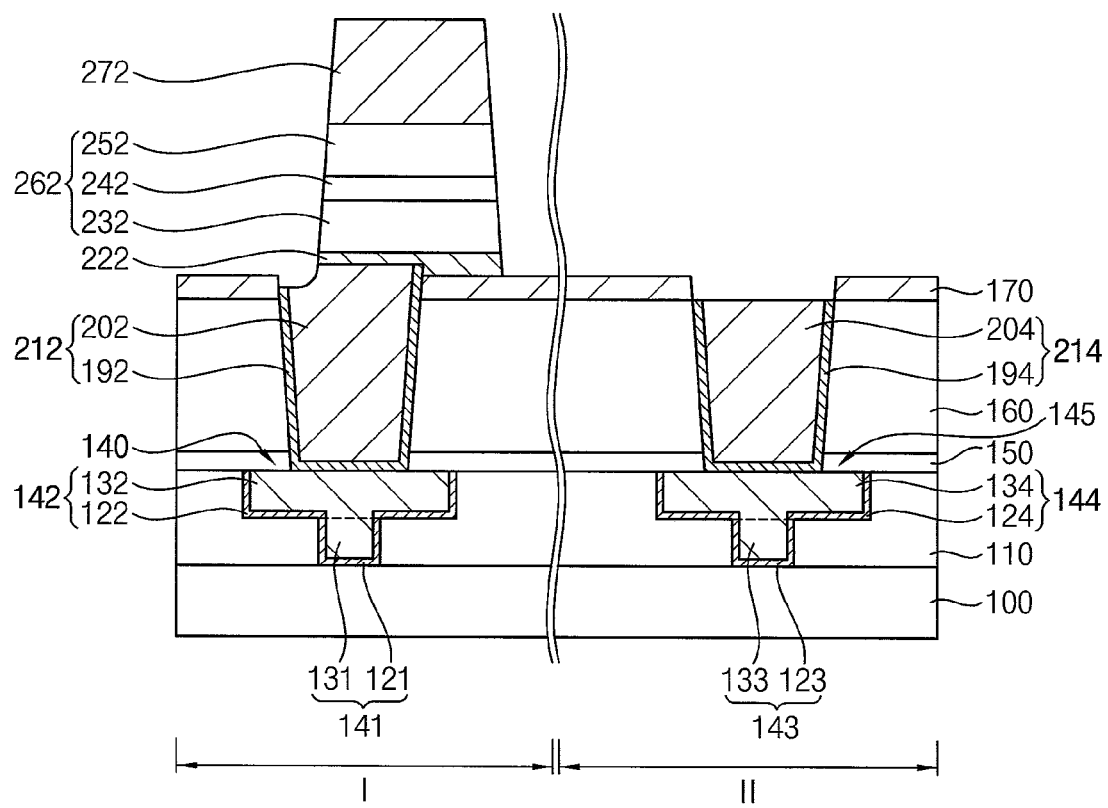

Referring to FIG. 19A, processes that are substantially the same as or similar to those described with reference to FIGS. 1 and 7 may be performed.

However, the planarization pattern 222 and the MTJ structure 262 formed by an IBE process may not cover the whole upper surface of the lower electrode 212, but may cover only a portion of the upper surface of the lower electrode 212, which may occur due to the misalignment and/or the layout of the MTJ structures 262.

Thus, an upper portion of the lower electrode 212 that has been exposed by the IBE process may be also removed. The second etch-stop layer 170 may, however, still remain on the second insulating interlayer 160. Thus, an amount of a re-deposited portion of the exposed lower electrode 212 on the sidewall of the MTJ structure 262 due to the removal thereof may be relatively small.

Figure 19B:
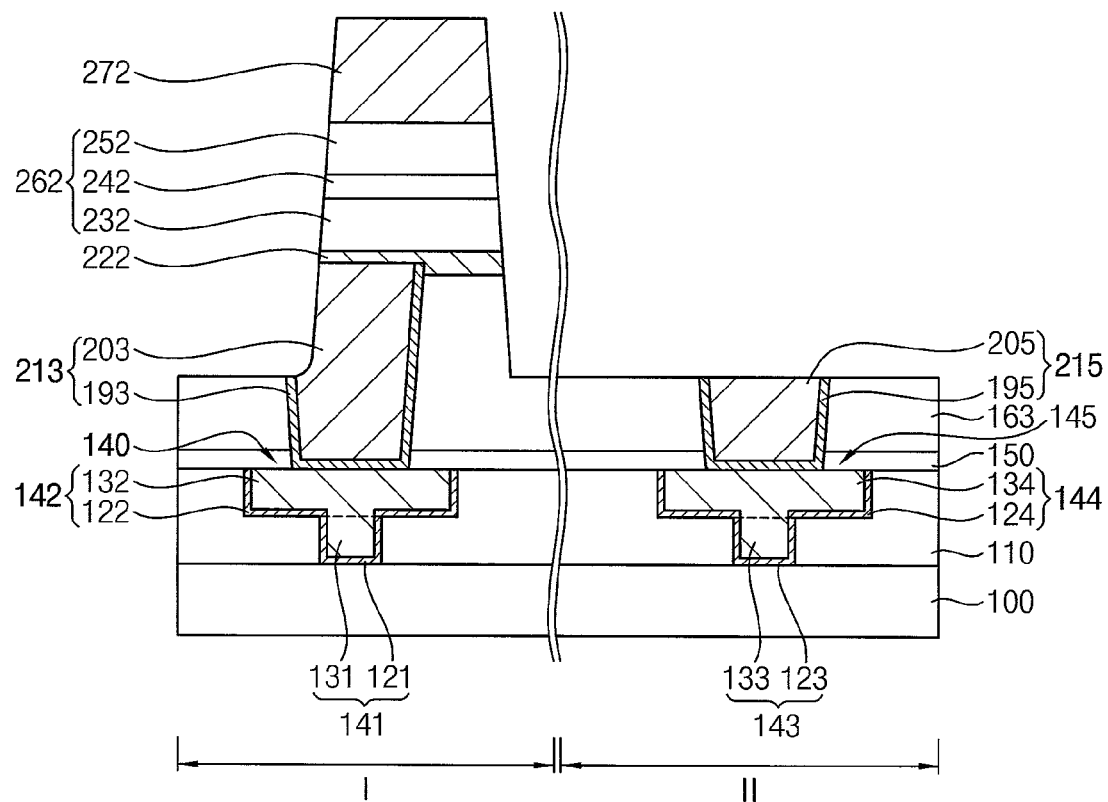

FIG. 19B shows a comparative example having no second etch-stop layer on the second insulating interlayer 160.

As the second etch-stop layer 170 is not formed, an upper portion of the second insulating interlayer 160 may be also removed in the IBE process. Thus, an upper portion of the lower electrode, which is covered by the second insulating interlayer 160, may be also removed. Thus, an amount of the exposed lower electrode 212 that is redeposited on the sidewall of the MTJ structure 262 due to the removal of the exposed lower electrode 212 may be relatively large.

As a result of the etching process, the lower electrode 212 may remain as an exposed lower electrode pattern 213, and the second insulating interlayer 160 may be transformed into a second insulating interlayer pattern 163. That is, a portion of the exposed lower electrode 212 may be etched, thereby forming a exposed lower electrode patter 213. Similarly, the second insulating interlayer 160 may be etched, thereby forming a second insulating interlayer pattern 163.

A landing pad pattern 215 having a reduced height may remain in the second insulating interlayer pattern 163. The remaining landing pattern 215 may include a ninth conductive pattern 205 and a ninth barrier pattern 195 that covers a bottom and a sidewall of the ninth conductive pattern 205.

Figure 19C:
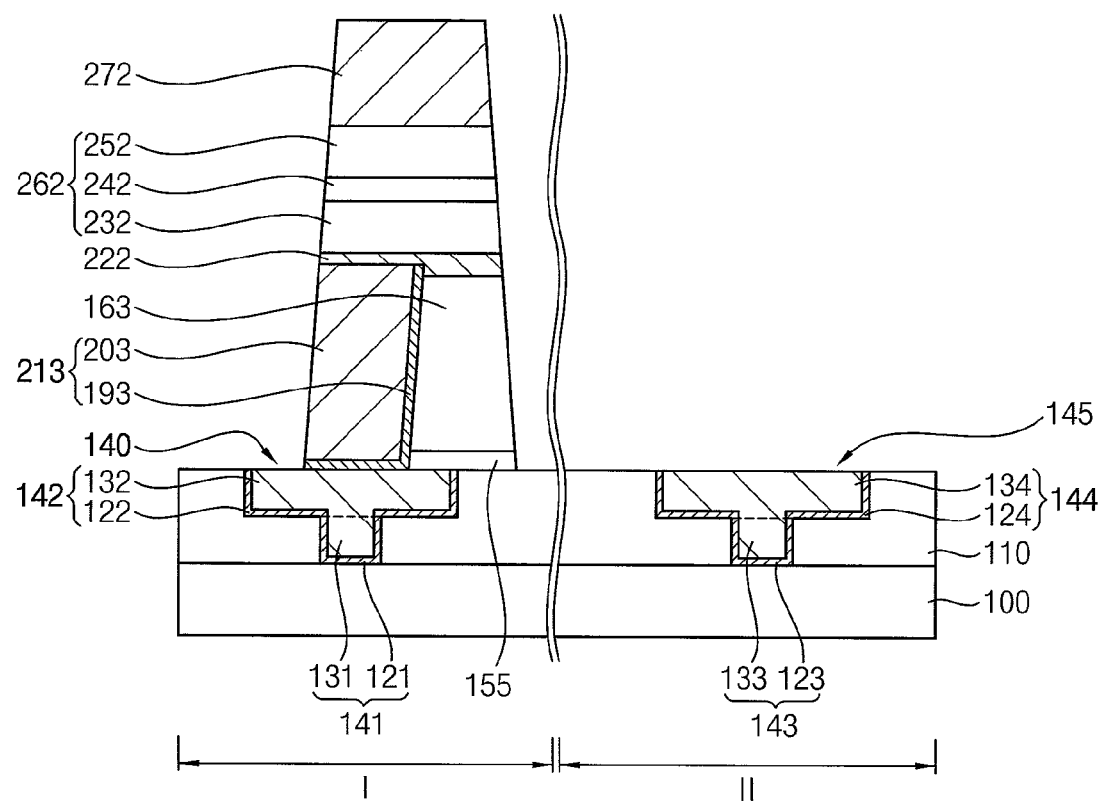

FIG. 19C shows a comparative example having no second etch-stop layer on the second insulating interlayer 160. In this case, as the IBE process is performed, most of the second insulating interlayer 160 may be removed except for a portion of the second insulating interlayer 160 under the planarization pattern 222 and the first etch-stop layer 150 may be removed.

Thus, an amount of the exposed lower electrode 212 may be redeposited on the sidewall of the MTJ structure 262 due to the removal of the exposed lower electrode 212 may be relatively large, and the first wiring 142 of the first wiring structure 140 may be exposed to cause an electrical short. Additionally, the landing pad 214 may not remain, but be removed so that voids and/or seams may be formed in a third via of a third wiring structure 340.

Figure 20A:
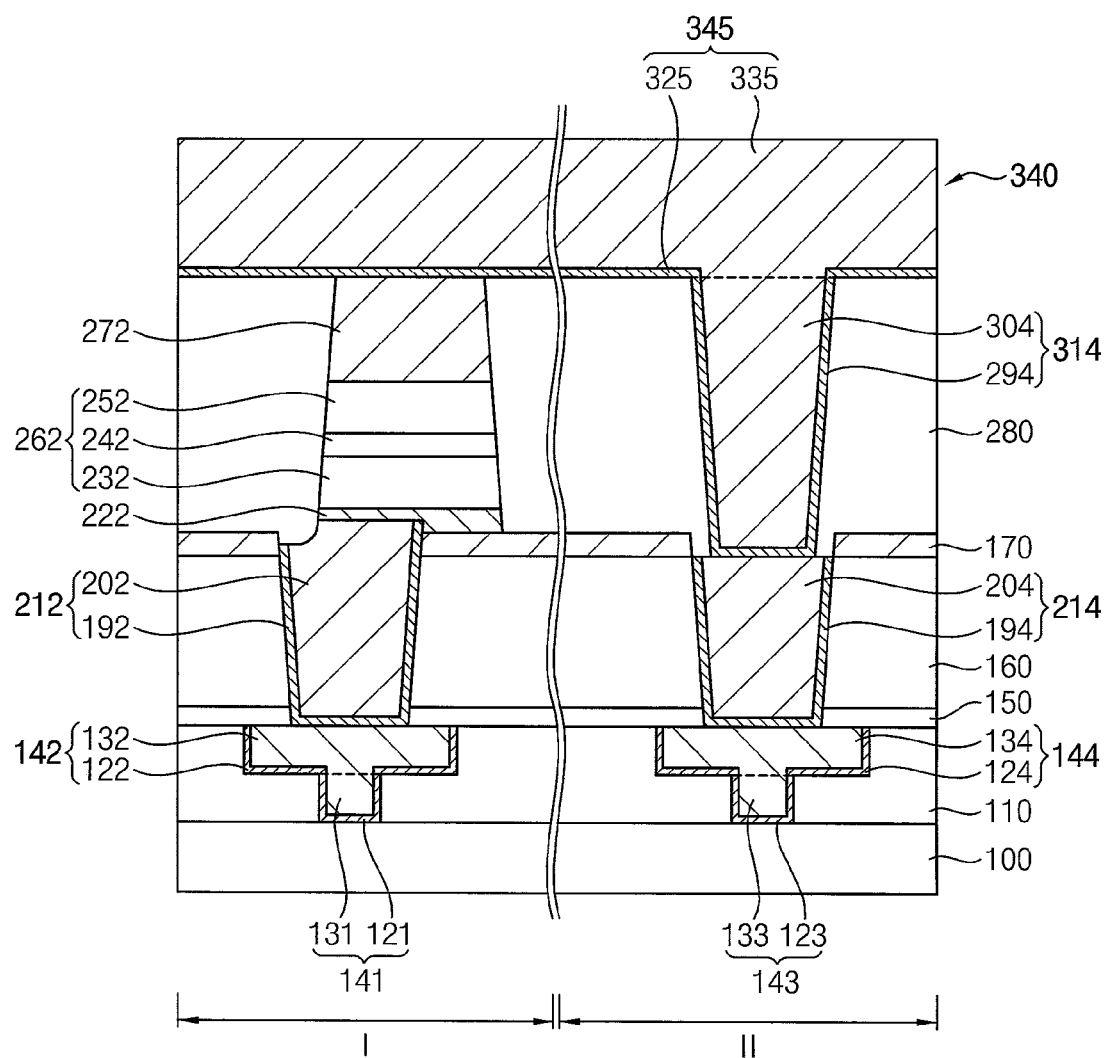

Referring to FIG. 20A, a process that is substantially the same as or similar to that described with reference to FIG. 8 may be performed.

Thus, the third insulating interlayer 280 may be formed on the upper electrode 272, the MTJ structure 262, the planarization pattern 222, the second etch-stop layer 170, the exposed lower electrode 212 and the landing pad 214. A third wiring structure 340 may be formed through the third insulating interlayer 280 to commonly contact upper surfaces of the landing pad 214 and the upper electrode 272.

Figure 20B:
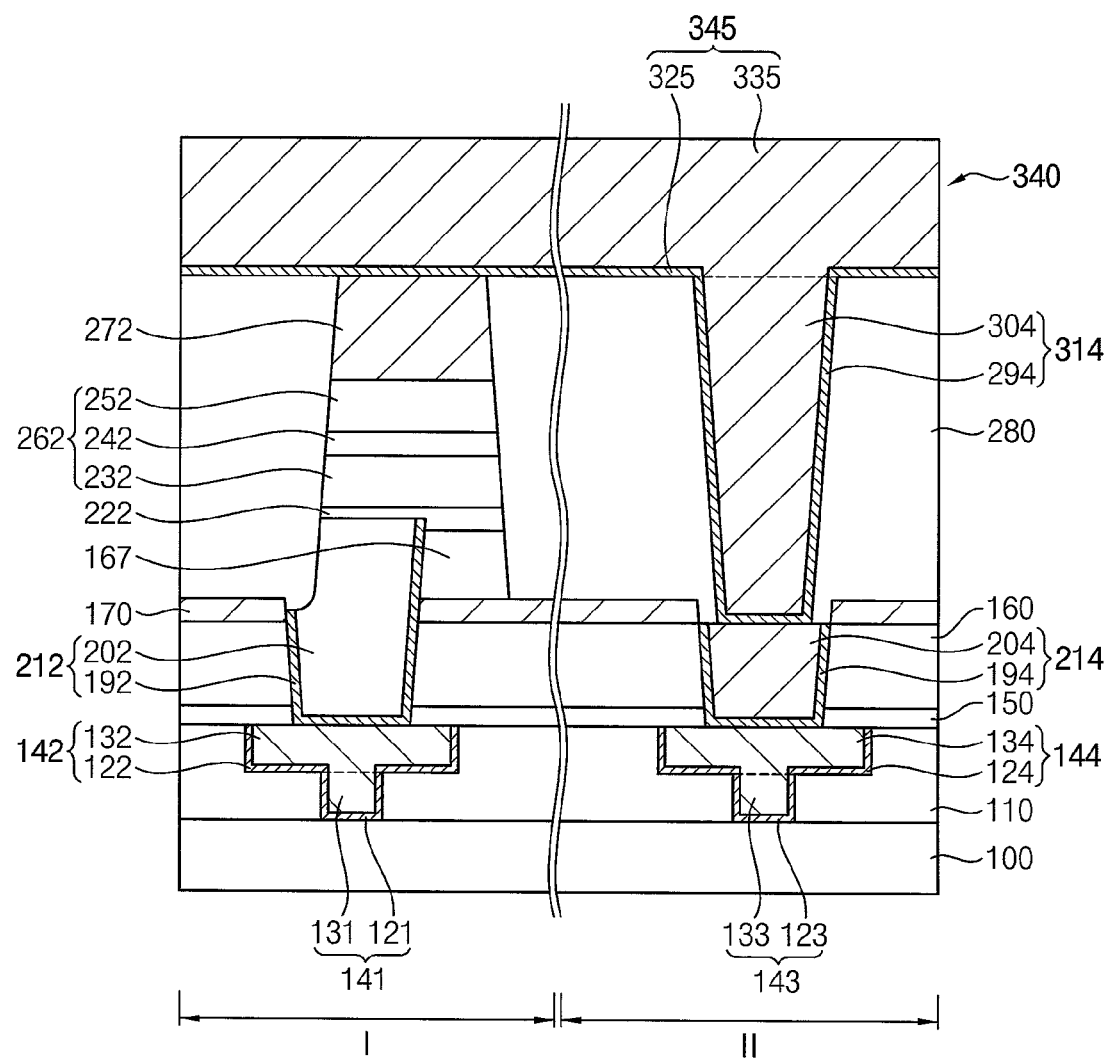
Figure 20C:
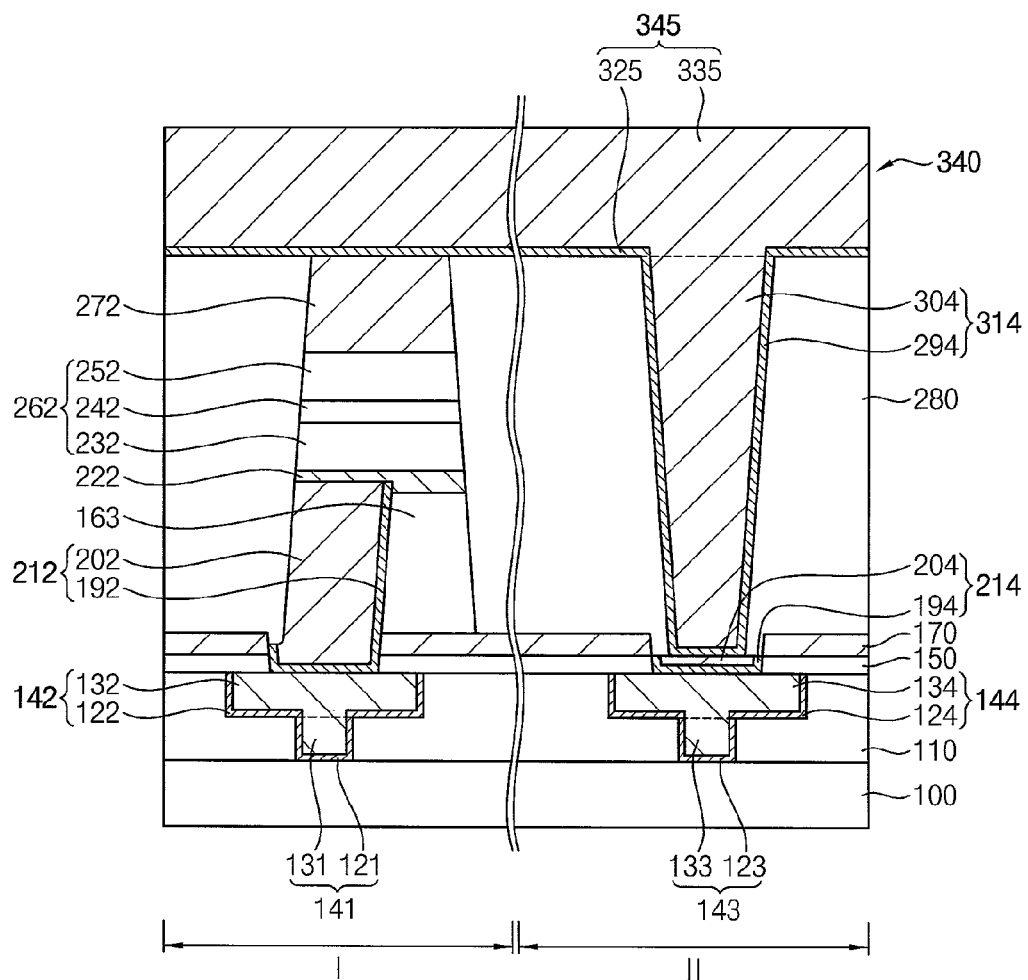

FIG. 20B shows that the fourth insulating interlayer 165 may be formed on the second etch-stop layer 170 and transformed into the insulation pattern 167 that covers an upper sidewall of the exposed lower electrode 212. FIG. 20C shows that when the second etch-stop layer 170 and the second insulating interlayer 160 are sequentially formed on the first etch-stop layer 150, the second insulating interlayer pattern 163 may remain covering a sidewall of the lower electrode 212.

Figure 21:
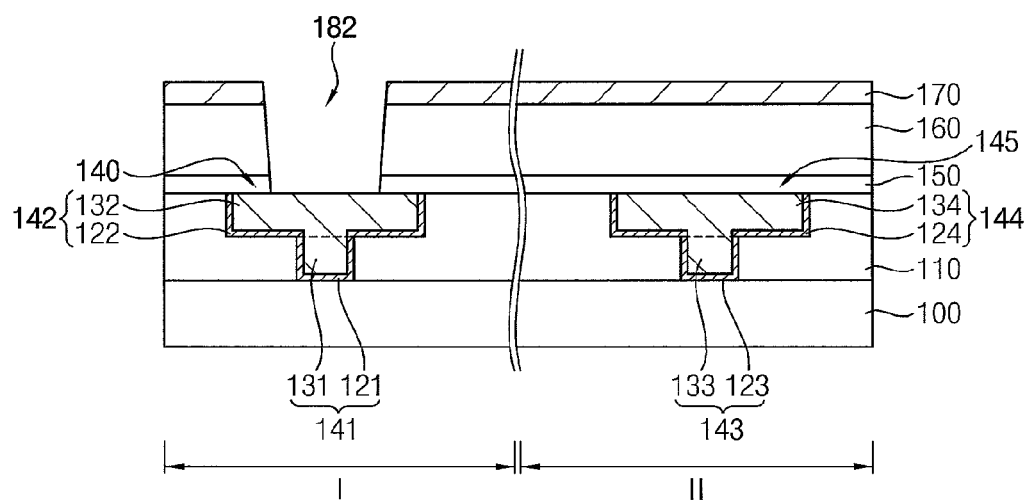
Figure 22:
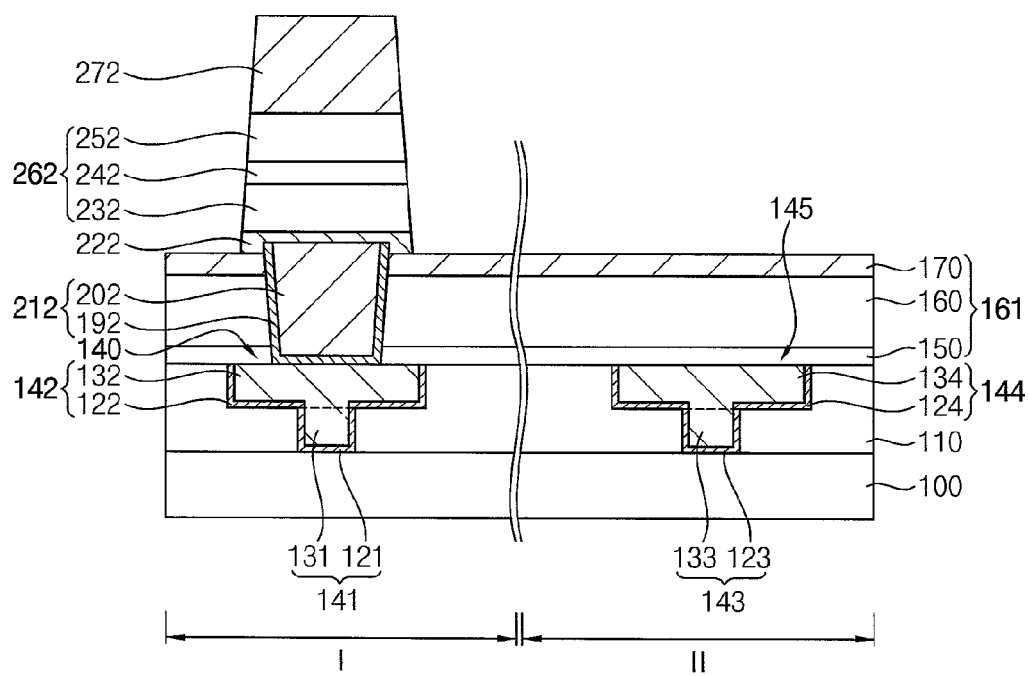

FIGS. 21 to 23 are cross-sectional views depicting stages of another method of manufacturing an MRAM device in accordance with example embodiments. This method may include processes substantially the same as or similar to those described with reference to FIGS. 1 to 9. Thus, like reference numerals refer to like elements, and detailed descriptions of like elements may be omitted below in the interest of brevity.

Referring to FIG. 21, processes that are substantially the same as or similar to those described with reference to FIGS. 1 and 3 may be performed.

However, the second insulating interlayer 160 may be formed to have a thickness that is less than a thickness of the second insulating interlayer 160 of FIG. 2. In an example embodiment, the second insulating interlayer 160 of FIG. 21 may have a thickness that may be about half of the thickness of the second insulating interlayer 160 of FIG. 2.

Only the first opening 182 that exposes an upper surface of the first wiring structure may be formed, while no second opening that exposes an upper surface of the second wiring structure 145 may be formed.

Referring to FIG. 22, a process that is substantially the same as or similar to that described with reference to FIGS. 4 to 7 may be performed.

The electrode 212 may, however, be formed through the insulating interlayer structure 161 to contact an upper surface of the lower electrode 212, while no landing pad may be formed through the insulating interlayer structure 161 to contact an upper surface of the second wiring structure 145.

Figure 23A:
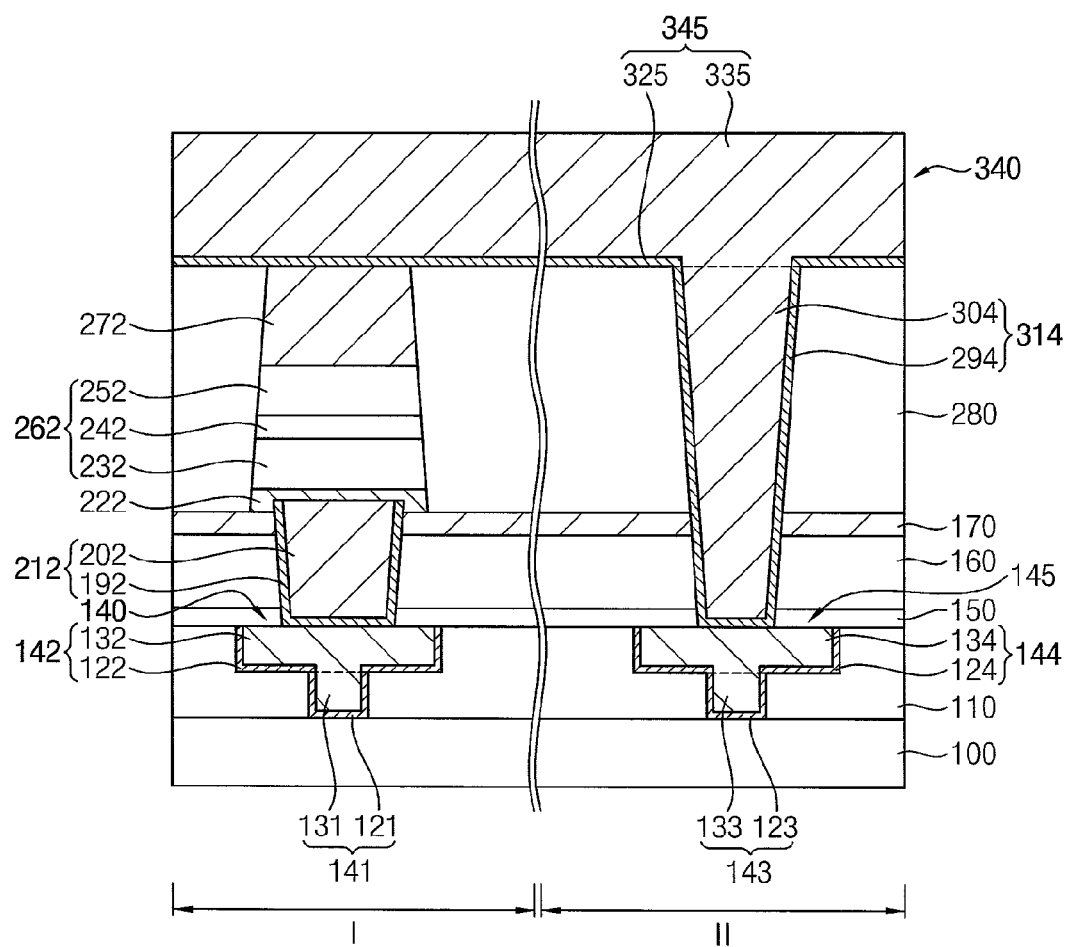

Referring to FIG. 23A, a process that is substantially the same as or similar to that described with reference to FIG. 8 may be performed.

The third via 314 of the third wiring structure 340 may, however, be formed to directly contact an upper surface of the second wiring 144 of the second wiring structure 145.

That is, no landing pad may be formed on the second wiring structure 145, and thus the third wiring structure 340 may be directly connected to the second wiring structure 145. Since the second insulating interlayer 160 may have a relatively small thickness, even if no landing pad exists, the third via hole may not be formed to have a deep depth. Thus, the third via 314 may sufficiently fill the third via hole.

If, however, the second etch-stop layer 170 is not formed when the second insulating interlayer 160 has a relatively small thickness, as described with reference to FIGS. 19B and 19C, the second insulating interlayer 160 may be removed in the IBE process to expose upper surfaces of the first wiring structure 140 and the second wiring structure 145, which may cause an electrical short. However, in example embodiments, since the second etch-stop layer 170 may be formed on the second insulating interlayer 160, even if the second insulating interlayer 160 may have a relatively small thickness, the second insulating interlayer 160 may not be completely removed. Thus, the upper surfaces of the first wiring structure 140 and the second wiring structure 145 may not be exposed.

Figure 23B:
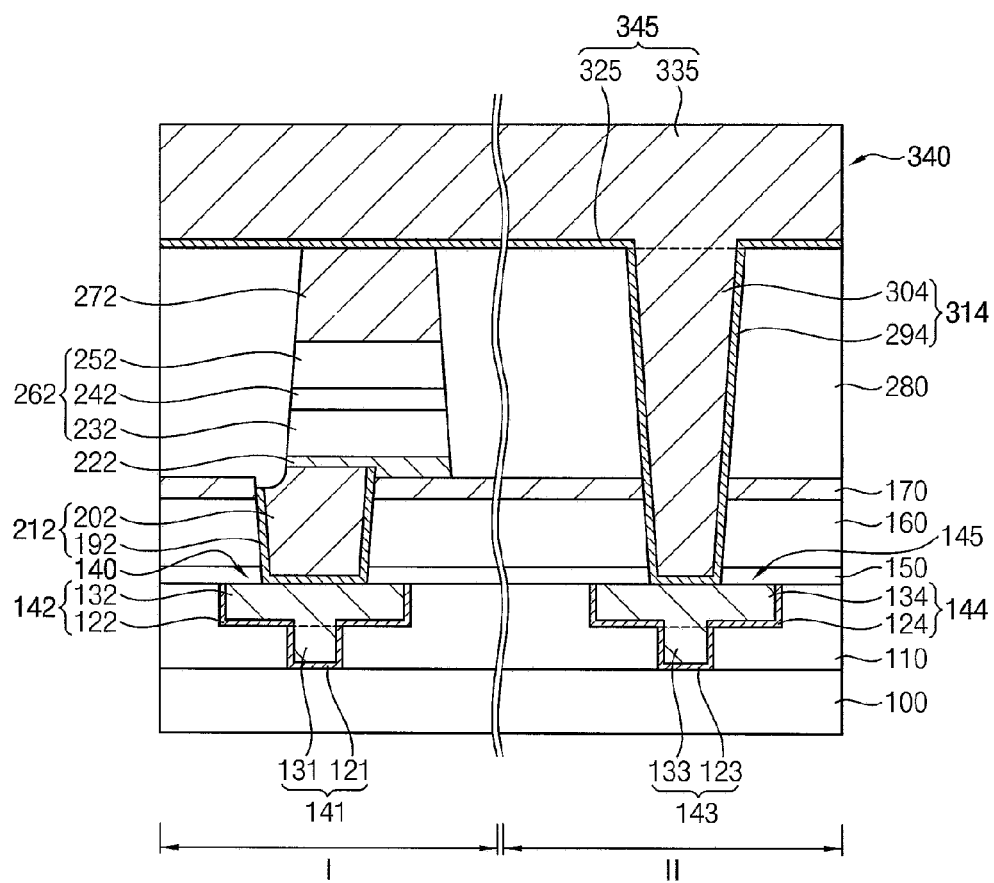

FIG. 23B shows that the MTJ structure 262 may overlap a portion of the upper surface of the lower electrode 212.

Figure 24:
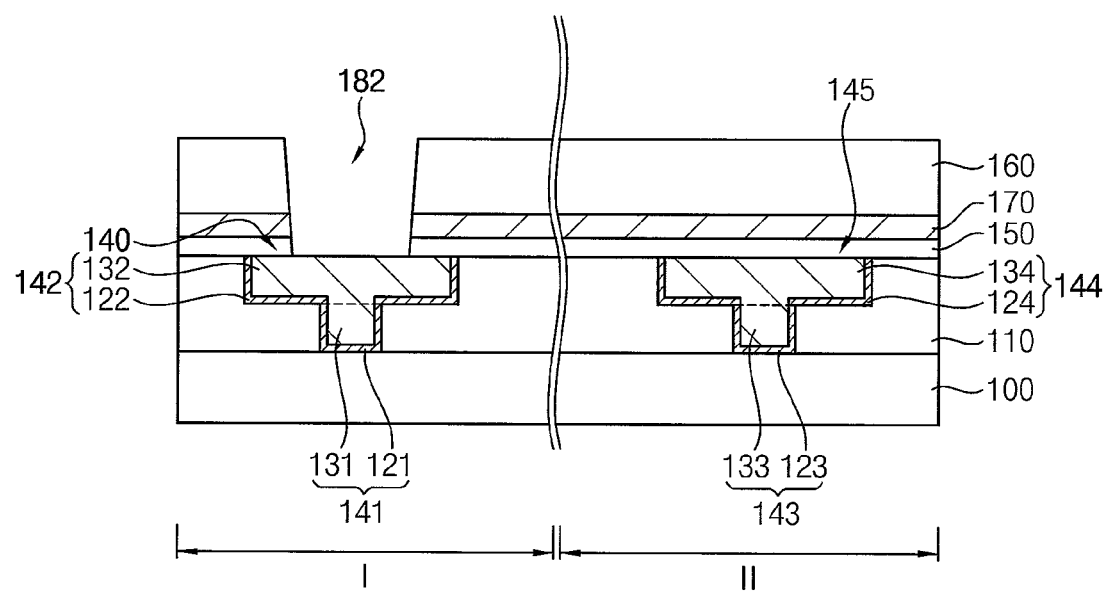

FIGS. 24 to 25 are cross-sectional views depicting stages of another method of manufacturing an MRAM device in accordance with example embodiments. This method may include processes that are substantially the same as or similar to those described with reference to FIGS. 21 to 23. Thus, like reference numerals refer to like elements, and detailed descriptions of like elements may be omitted below in the interest of brevity.

Referring to FIG. 24, processes that are substantially the same as or similar to those described with reference to FIG. 21 may be performed.

The first etch-stop layer 150, the second etch-stop layer 170 and the second insulating interlayer 160 may, however, be sequentially formed on the first wiring structure 140 and the second wiring structure 145 and the first insulating interlayer 110.

Figure 25A:
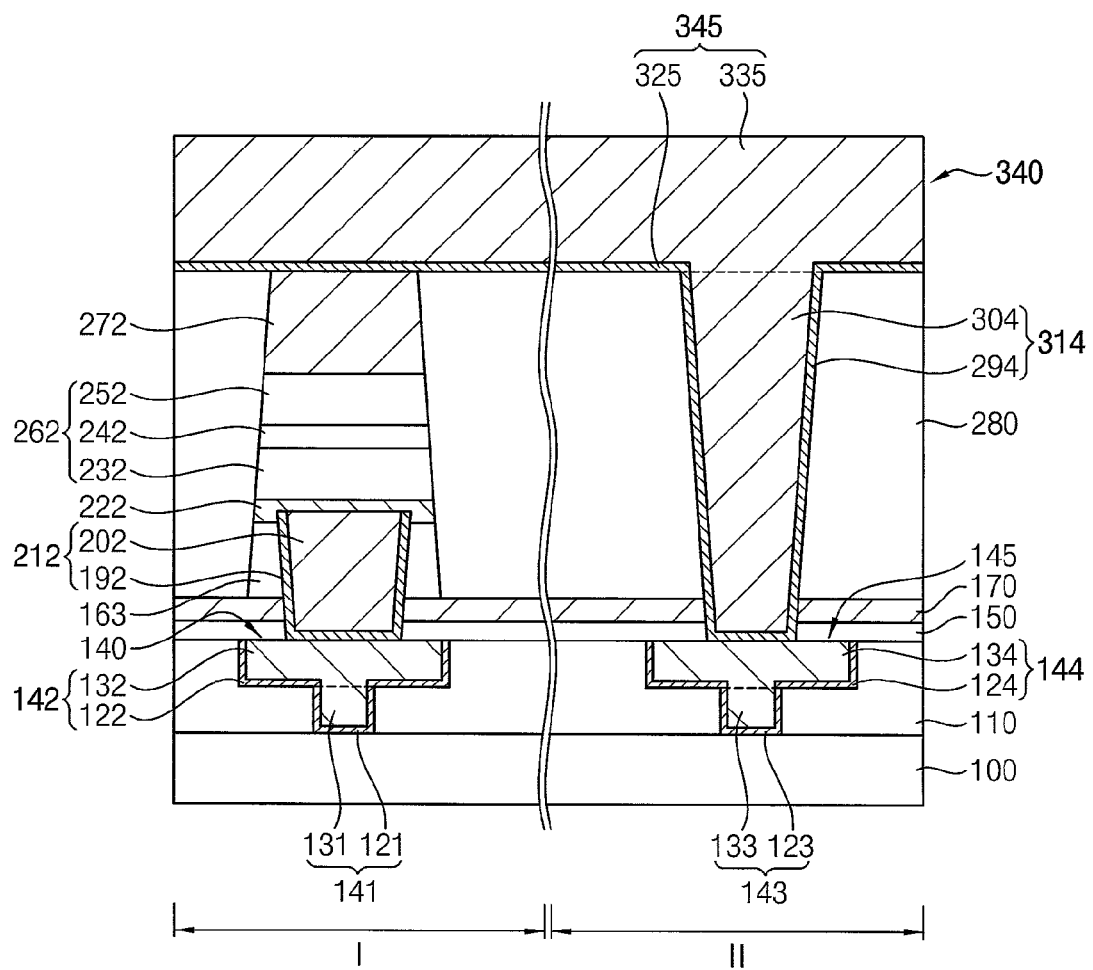

Referring to FIG. 25A, a process that is substantially the same as or similar to that described with reference to FIGS. 22 to 23 may be performed.

The lower electrode 212 may be formed through the first and second etch-stop layers 150 and 170 to protrude from an upper surface of the second etch-stop layer 170. The second insulation interlayer pattern 163 may cover a sidewall of the protruding lower electrode 212.

Figure 25B:
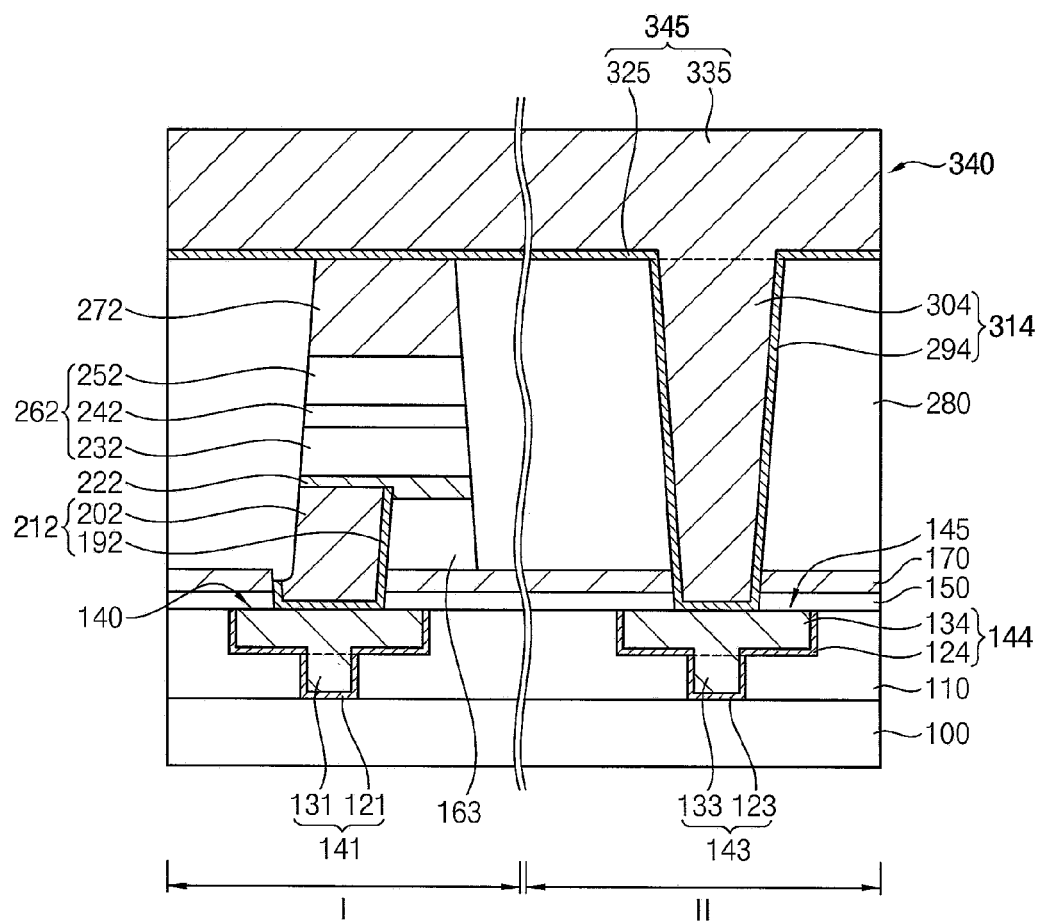

FIG. 25B shows that the MTJ structure 262 may overlap a portion of an upper surface of the lower electrode 212.

Figure 26:
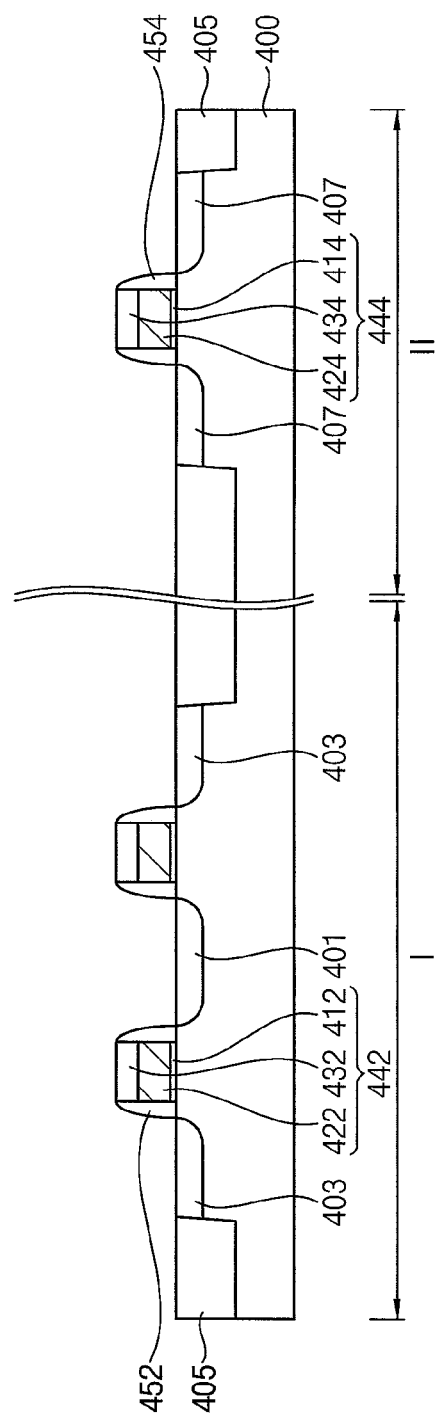
Figure 27:
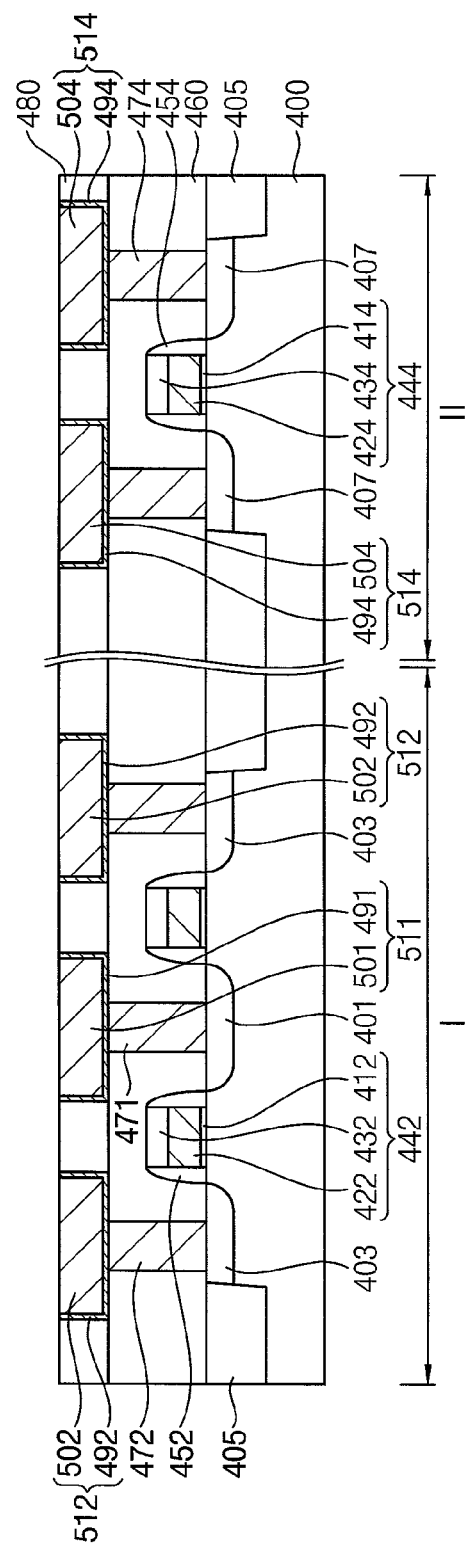
Figure 28:
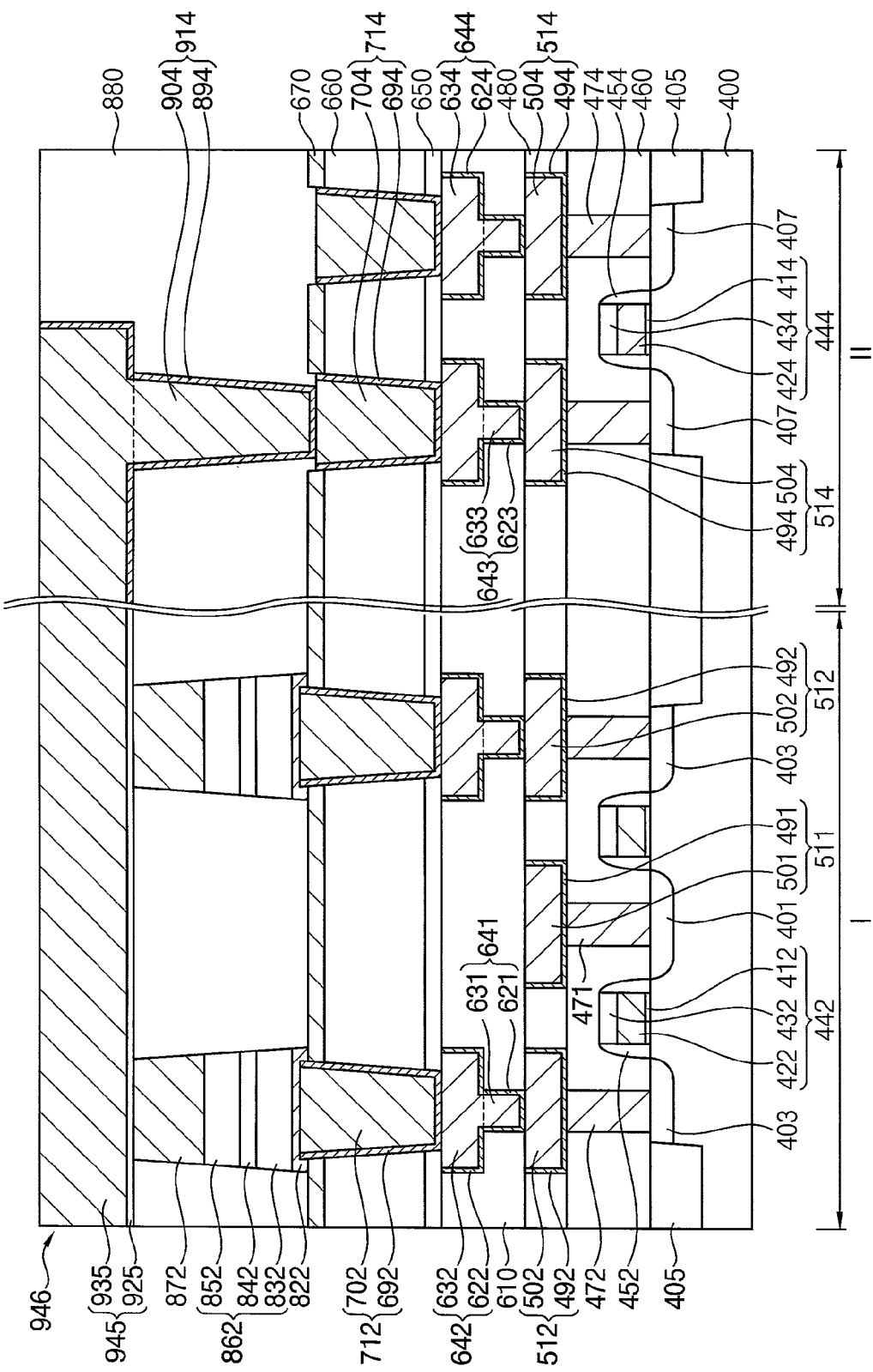

FIGS. 26 to 28 are cross-sectional views depicting stages of another method of manufacturing an MRAM device in accordance with example embodiments. This method may include processes that are substantially the same as or similar to those described with reference to FIGS. 1 to 9, and detailed descriptions of those processes may be omitted below in the interest of brevity.

Referring to FIG. 26, first and second gate structures 442 and 444 may be formed on a substrate 400 having an isolation layer 405. First and second impurity regions 401 and 403 may be formed at upper portions of the substrate 400 that are adjacent to the first gate structure 442. A third impurity region 407 may be formed at an upper portion of the substrate 400 adjacent to the second gate structure 444.

The substrate 400 may include first and second regions I and II, and in example embodiments, the first region I may serve as a cell region and the second region II may serve as a peripheral region or a logic region. The isolation layer 405 may be formed of an oxide, e.g., silicon oxide. In example embodiments, the isolation layer 405 may be formed by a shallow trench isolation (STI) process.

The first gate structure 442 may include a first gate insulation pattern 412, a first gate electrode 422 and a first gate mask 432 that are sequentially stacked on the first region I of the substrate 400. The second gate structure 444 may include a second gate insulation pattern 414, a second gate electrode 424 and a second gate mask 434 that are sequentially stacked on the second region II of the substrate 400.

First and second gate spacers 452 and 454 may be further formed on the respective sidewalls of the first and second gate structures 442 and 444.

The first to third impurity regions 401, 403 and 407 may be doped with n-type or p-type impurities. In an example embodiment, the first to third impurity regions 401, 403 and 407 may be formed by doping impurities into upper portions of the substrate 400. Alternatively, the first to third impurity regions 401, 403 and 407 may be formed by forming recesses at upper portions of the substrate 400 and performing a selective epitaxial growth (SEG) process to fill the recesses. The first to third impurity regions 401, 403 and 407 may include single crystalline silicon, single crystalline silicon carbide, or single crystalline silicon-germanium.

The first and second gate structures 442 and 444 together with the first to third impurity regions 401, 403 and 407 may form transistors. In an example embodiment, the transistors may be planar transistors. Although not depicted in FIG. 26, the transistors may alternatively be fin-type field effect transistors (finFETs). As yet another non-depicted embodiment, the transistors may alternatively be vertical-channel transistors.

Referring to FIG. 27, a first insulating interlayer 460 may be formed on the substrate 400 to cover the first and second gate structures 442 and 444 and the first and second gate spacers 452 and 454. First to third contact plugs 471, 472 and 474 may be formed through the first insulating interlayer 460 to respectively contact the first to third impurity regions 401, 403 and 407.

The first to third contact plugs 471, 472 and 474 may be formed of a metal, a metal nitride, doped polysilicon and/or a metal silicide.

A second insulating interlayer 480 may be formed on the first to third contact plugs 471, 472 and 474 and the first insulating interlayer 460. First to third wirings 511, 512 and 514 may be formed through the second insulating interlayer 480 to respectively contact the first to third contact plugs 471, 472 and 474.

In example embodiments, the first to third wirings 511, 512 and 514 may be formed by a single damascene process. Alternatively, the first to third wirings 511, 512 and 514 may be formed by a dual damascene process.

Accordingly, the first wiring 511 may include a first conductive pattern 501 and a first barrier pattern 491 that covers a bottom and a sidewall of the first conductive pattern

501. The second wiring 512 may include a second conductive pattern 502 and a second barrier pattern 492 that covers a bottom and a sidewall of the second conductive pattern 502 The third wiring 514 may include a third conductive pattern 504 and a third barrier pattern 494 that covers a bottom and a sidewall of the third conductive pattern 504.

The first to third conductive patterns 501, 502 and 504 may be formed of a metal, e.g., tungsten, copper, aluminum, etc. The first to third barrier patterns 491, 492 and 494 may be formed of a metal nitride, e.g., tantalum nitride, titanium nitride, etc., and/or a metal, e.g., tantalum, titanium, etc.

The first wiring 511 may serve as a source line of for an MRAM device according to the subject matter disclosed herein.

Referring to FIG. 28, processes that are substantially the same as or similar to those described with reference to FIGS. 1 to 9 may be performed.

Thus, a third insulating interlayer 610 may be formed on the first to third wirings 511, 512 and 514 and the second insulating interlayer 480. A fourth wiring structure 642 and a fifth wiring structure 644 may be formed through the third insulating interlayer 610.

The fourth wiring structure 642 may include a first via 641 and a first wiring 632 that may be integrally formed with each other. The fifth wiring structure 644 may include a second via 624 and a second wiring 634 that may be integrally formed with each other.

The first via 641 may include a fourth conductive pattern 631 and a fourth barrier pattern 621 that covers a bottom and a sidewall of the fourth conductive pattern 631. The second via 643 may include a fifth conductive pattern 633 and a fifth barrier pattern 623 that covers a bottom and a sidewall of the fifth conductive pattern 633. The fourth wiring 642 may include a sixth conductive pattern 632 and a sixth barrier pattern 622 that covers a portion of a bottom and a sidewall of the sixth conductive pattern 632. The fifth wiring 644 may include a seventh conductive pattern 634 and a seventh barrier pattern 624 that covers a portion of a bottom and a sidewall of the seventh conductive pattern 634.

An insulating interlayer structure including a first etch-stop layer 650, a fourth insulating interlayer 660 and a second etch-stop layer 670 that are sequentially stacked may be formed on the fourth and fifth wiring structures and the third insulating interlayer 610, and a lower electrode 712. A landing pad 714 may be formed through the insulating interlayer structure to respectively contact the fourth and fifth wiring structures on the first and second regions I and II.

The lower electrode 712 may include an eighth conductive pattern 702 and an eighth barrier pattern 692 that covers a bottom and a sidewall of the eighth conductive pattern 702. The landing pad 714 may include a ninth conductive pattern 704 and a ninth barrier pattern 694 that covers a bottom and a sidewall of the ninth conductive pattern 704.

A planarization pattern 822, an MTJ structure 862 and an upper electrode 872 may be sequentially stacked on the lower electrode 712 to at least partially overlap the lower electrode 712. The MTJ structure 862 may include a fixed magnetic pattern 832, a tunnel barrier pattern 842 and a free magnetic pattern 852 that are sequentially stacked. In one embodiment, a plurality of MTJ structures 862 may be organized in an array that is arranged to have at least one row and at least one column when viewed from a plan view of FIG. 28. As viewed in the cross-sectional view of FIG. 28, a portion of one row of an array of MTJ structures 862 is shown. It should be understood that if a plurality of MTJ structures 862 are arranged in an array of at least one row and at least one column, the array may be included in a first region I. Similarly, if a plurality of MTJ structures 862 are arranged in an array of at least one row and at least one column, the structures and features described herein as part of the subject matter disclosed herein may also be included in either a first region I and/or a first region II.

A fifth insulating interlayer 880 may be formed on the second etch-stop layer 670 and the landing pad 714 to cover the upper electrode 872, the MTJ structure 862 and the planarization pattern 822. A sixth wiring structure 946 may be formed through the fifth insulating interlayer 880 to commonly contact the landing pad 714 and the upper electrode 872.

The sixth wiring structure 946 may include a third via 914 and a sixth wiring 945 that may be integrally formed. In example embodiments, the sixth wiring 945 may serve as a bit line for a MRAM device according to the subject matter disclosed herein.

The third via 914 may include a tenth conductive pattern 904 and a tenth barrier pattern 894 that covers a bottom and a sidewall of the tenth conductive pattern 904. The sixth wiring 945 may include an eleventh conductive pattern 935 and an eleventh barrier pattern 925 that covers a bottom and a sidewall of the eleventh conductive pattern 935.

Figure 29:
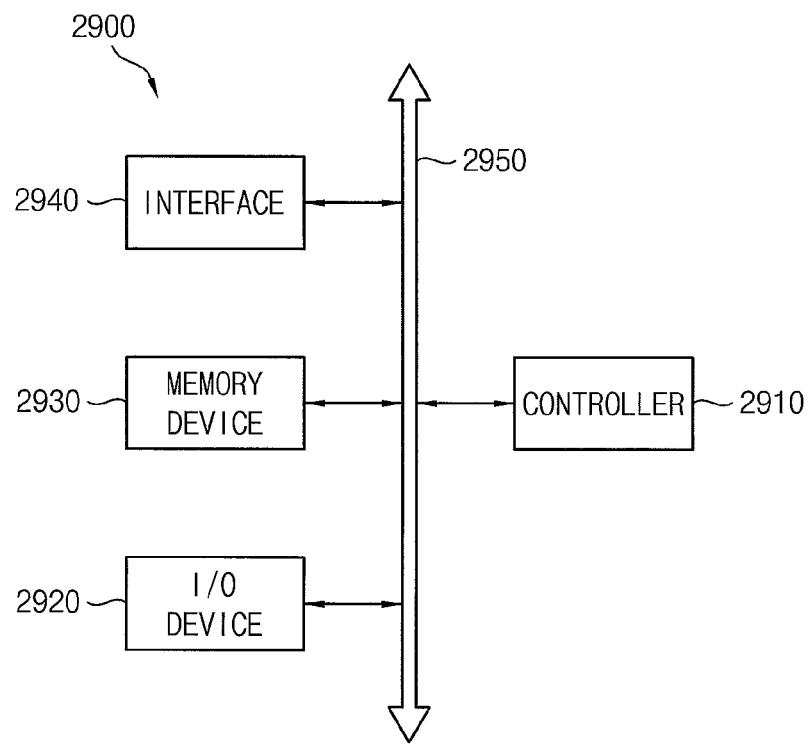
FIG. 29 depicts an electronic device that comprises one or more integrated circuits (chips) comprising an MRAM device in accordance with example embodiments.

FIG. 29 depicts an electronic device 2900 that comprises one or more integrated circuits (chips) comprising a semiconductor device that includes an MRAM according to embodiments disclosed herein. Electronic device 2900 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 2900 may comprise a controller 2910, an input/output device 2920 such as, but not limited to, a keypad, a keyboard, a display, or a touch-screen display, a memory 2930, and a wireless interface 2940 that are coupled to each other through a bus 2950. The controller 2910 may comprise, for example, at least one microprocessor, at least one digital signal process, at least one microcontroller, or the like. The memory 2930 may be configured to store a command code to be used by the controller 2910 or a user data. Electronic device 2900 and the various system components comprising a semiconductor device that includes an MRAM according to embodiments disclosed herein. The electronic device 2900 may use a wireless interface 2940 configured to transmit data to or receive data from a wireless communication network using a RF signal. The wireless interface 2940 may include, for example, an antenna, a wireless transceiver and so on. The electronic system 2900 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multi-channel Multipoint Distribution Service (MMDS), and so forth.

Figure 30:
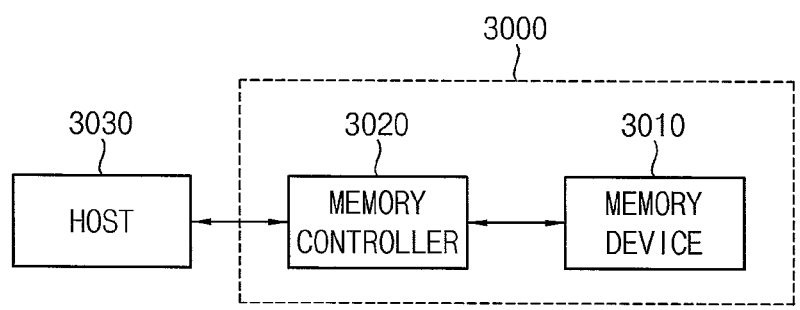
FIG. 30 depicts a memory system that may comprise one or more integrated circuits (chips) comprising a semiconductor device that includes an MRAM device in accordance with example embodiments.

FIG. 30 depicts a memory system 3000 that may comprise one or more integrated circuits (chips) comprising a semiconductor device that includes an MRAM according to embodiments disclosed herein. The memory system 3000 may comprise a memory device 3010 for storing large amounts of data and a memory controller 3020. The memory controller 3020 controls the memory device 3010 to read data stored in the memory device 3010 or to write data into the memory device 3010 in response to a read/write request of a host 3030. The memory controller 3020 may include an address-mapping table for mapping an address provided from the host 3030 (e.g., a mobile device or a computer system) into a physical address of the memory device 3010. The memory device 3010 may comprise one or more semiconductor devices a semiconductor device that includes an MRAM according to embodiments disclosed herein.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents, but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a magnetoresistive random access memory (MRAM) device, comprising:
    sequentially forming a first insulating interlayer and an etch-stop layer on a substrate;
    after forming the etch-stop layer forming a lower electrode through the etch-stop layer and the first insulating interlayer, the lower electrode extending in both of the etch-stop layer and the first insulating interlayer;
    sequentially forming a magnetic tunnel junction (MTJ) structure layer and an upper electrode on the lower electrode and the etch-stop layer; and
    patterning the MTJ structure layer by a physical etching process using the upper electrode as an etching mask to form an MTJ structure that at least partially contacts the lower electrode, wherein the first insulating interlayer is protected by the etch-stop layer so as not to be etched by the physical etching process.

2. The method of claim 1, wherein the etch-stop layer includes a metal oxide, a nitride, a ceramic material, or a combination thereof.

3. The method of claim 2, wherein the metal oxide includes aluminum oxide, magnesium oxide, yttrium oxide, erbium oxide, or a combination thereof.

4. The method of claim 2, wherein the nitride includes boron nitride.

5. The method of claim 2, wherein the ceramic material includes yttrium silicon oxide, zirconium titanium oxide, barium titanium oxide, or a combination thereof.

6. The method of claim 1, wherein the physical etching process includes an ion beam etching (IBE) process.

7. The method of claim 1, wherein at least a portion of the etch-stop layer remains on the first insulating interlayer after the physical etching process.

8. The method of claim 1, wherein the MTJ structure covers an entire upper surface of the lower electrode.

9. The method of claim 1, wherein the MTJ structure covers a portion of an upper surface of the lower electrode, and wherein a recess is formed at an upper portion of the lower electrode by the physical etching process, a bottom of the recess not being lower than a lower surface of the etch-stop layer.

10. The method of claim 1, wherein forming the lower electrode includes forming a landing pad through the etch-stop layer and the first insulating interlayer that is spaced apart from the lower electrode.

11. The method of claim 10, wherein forming the lower electrode and the landing pad includes:
    forming first and second openings through the etch-stop layer and the first insulating interlayer;
    forming a conductive layer on the etch-stop layer to fill the first and second openings; and
    planarizing the conductive layer until an upper surface of the etch-stop layer is exposed.

12. The method of claim 11, wherein upper surfaces of the lower electrode and the landing pad are substantially higher than the upper surface of the etch-stop layer.

13. A method of manufacturing a magnetoresistive random access memory (MRAM) device, comprising:
    forming an insulating interlayer structure on a substrate, the insulating interlayer structure including a first insulating interlayer, an etch-stop layer, and a second insulating interlayer sequentially stacked;
    after forming the insulating interlayer structure, forming a lower electrode through the insulating interlayer structure, the lower electrode extending in all of the first insulating interlayer, the etch-stop layer and the second insulating interlayer;
    sequentially forming a magnetic tunnel junction (MTJ) structure layer and an upper electrode on the lower electrode and the insulating interlayer structure; and
    patterning the MTJ structure layer by a physical etching process using the upper electrode as an etching mask to form an MTJ structure that at least partially contacts the lower electrode, wherein a portion of the insulating interlayer structure under the etch-stop layer is substantially protected by the etch-stop layer so as not to be etched by the physical etching process.

14. The method of claim 13, wherein the at least a portion of the etch-stop layer remains on the first insulating interlayer after the physical etching process.

15. A method to form a magnetoresistive random access memory (MRAM) device, the method comprising:
    forming a first insulating interlayer on a top surface of a substrate, the first insulating interlayer comprising a bottom surface and a top surface that is opposite the bottom surface, the bottom surface of the first insulating interlayer being proximate to the top surface of the substrate, and the top surface of the first insulating interlayer being distal to the top surface of the substrate;
    forming at least one first wiring structure in the first insulating interlayer, the at least one first wiring structure comprising a top surface, and at least a portion of the top surface of the at least one first wiring structure being at substantially a same level at the top surface of the first insulating interlayer;

forming an etch-stop layer on the top surface of the first insulating interlayer, the etch-stop layer comprising a bottom surface and a top surface that is opposite the bottom surface, the bottom surface of the etch-stop layer being proximate to the top surface of the first insulating interlayer, the top surface of the etch-stop layer being distal to the top surface of the first insulating interlayer, and the bottom surface of the etch-stop layer being lower than the top surface of the at least one first wiring structure;

forming a second insulating interlayer on the top surface of the etch-stop layer, the second insulating interlayer comprising a bottom surface and a top surface that is opposite the bottom surface, the bottom surface of the second insulating interlayer being proximate to the top surface of the etch-stop layer, and the top surface of the first insulating interlayer being distal to the top surface of the etch-stop layer;

forming at least one lower electrode disposed in the second insulating interlayer, the at least one lower electrode extending through the second insulating interlayer and contacting a corresponding first wiring structure; and forming at least one magnetic tunnel junction (MTJ) structure, each MTJ structure being electrically connected to a corresponding to a lower electrode.

16. The method of claim 15, further comprising forming a plurality of MTJ structures arranged in an array comprising at least one row and at least one column.

17. The method of claim 15, wherein the etch-stop layer comprises a metal oxide, a nitride, a ceramic material, or a combination thereof.

18. The method of claim 15, further comprising:

forming a third insulating interlayer on the top surface of the second insulating interlayer, the third insulating interlayer comprising a bottom surface and a top surface that is opposite the bottom surface, the bottom surface of the third insulating interlayer being proximate to the top surface of the second insulating interlayer, and the top surface of the third insulating interlayer being distal to the top surface of the second insulating interlayer; and forming at least one third wiring structure disposed in the third insulating interlayer, the at least one third wiring structure being electrically connected to a corresponding MTJ structure.

19. The method of claim 15, further comprising:

forming at least one landing pad disposed in the first insulating interlayer, the at least one landing pad comprising a top surface, and at least a portion of the top surface of the at least one landing pad being at substantially a higher level as the top surface of the first insulating interlayer, and wherein the bottom surface of the etch-stop layer is at substantially a lower level as the top surface of the at least one landing pad.

* * * * *